(12) United States Patent
Chang

(10) Patent No.: US 8,426,235 B2
(45) Date of Patent: *Apr. 23, 2013

(54) METHOD FOR MANUFACTURING CAPACITIVE ELECTROMECHANICAL TRANSDUCER

(75) Inventor: Chienliu Chang, Menlo Park, CA (US)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/319,970

(22) PCT Filed: May 13, 2010

(86) PCT No.: PCT/JP2010/003253
§ 371 (c)(1),
(2), (4) Date: Nov. 10, 2011

(87) PCT Pub. No.: WO2010/134302
PCT Pub. Date: Nov. 25, 2010

(65) Prior Publication Data
US 2012/0058587 A1 Mar. 8, 2012

(30) Foreign Application Priority Data
May 19, 2009 (JP) .................................. 2009-121006

(51) Int. Cl.
*H01L 21/02* (2006.01)

(52) U.S. Cl.
USPC .............. 438/53; 257/E21.002; 257/E21.211; 257/E21.215; 257/E21.216; 257/E21.479; 257/E21.485; 257/E21.499; 257/E21.532; 438/50; 438/106; 438/754

(58) Field of Classification Search ........... 257/E21.002, 257/E21.211, E21.215, E21.216, E21.479, 257/E21.485, E21.499, E21.532; 438/50, 438/53, 106, 754
See application file for complete search history.

(56) References Cited

U.S. PATENT DOCUMENTS

| 6,426,582 | B1 | 7/2002 | Niederer | |
|---|---|---|---|---|
| 2010/0327380 | A1* | 12/2010 | Chang | 257/419 |

FOREIGN PATENT DOCUMENTS

| EP | 1382565 A1 | 1/2004 |
|---|---|---|
| GB | 849477 A | 9/1960 |
| JP | 3-188300 A | 8/1991 |
| JP | 6-216111 A | 8/1994 |

(Continued)

OTHER PUBLICATIONS

Ergun et al., Capacitive Micromachined Ultrasonic Transducers: Fabrication Technology, IEEE Transactions on Ultrasonics, Ferroelectrics and Frequency Control, vol. 52, No. 12, , Dec. 2005; pp. 2242-2258.

(Continued)

*Primary Examiner* — Asok K Sarkar
(74) *Attorney, Agent, or Firm* — Canon U.S.A., Inc. IP Division

(57) ABSTRACT

A capacitive electromechanical transducer includes a substrate, a cavity formed by a vibrating membrane held above the substrate with a certain distance between the vibrating membrane and the substrate by supporting portions arranged on the substrate, a first electrode whose surface is exposed to the cavity, and a second electrode whose surface facing the cavity is covered with an insulating film, wherein the first electrode is provided on a surface of the substrate or a lower surface of the vibrating membrane and the second electrode is provided on a surface of the vibrating membrane or a surface of the substrate so as to face the first electrode. In this transducer, fine particles composed of an oxide film of a substance constituting the first electrode are arranged on the surface of the first electrode, and the diameter of the fine particles is 2 to 200 nm.

11 Claims, 19 Drawing Sheets

FOREIGN PATENT DOCUMENTS

| | | |
|---|---|---|
| JP | 2000-349065 A | 12/2000 |
| JP | 2005-27186 A | 1/2005 |
| JP | 2006-319712 A | 11/2006 |
| WO | 2006/092820 A2 | 9/2006 |
| WO | 2009/133961 A1 | 11/2009 |

OTHER PUBLICATIONS

Eccardt et al., Micromachined Transducers for Ultrasound Applications, IEEE Ultrasonic Symposium, 1997, p. 1609-1618.

* cited by examiner

METHOD FOR MANUFACTURING CAPACITIVE ELECTROMECHANICAL TRANSDUCER

TECHNICAL FIELD

The present invention relates to a method for manufacturing a capacitive electromechanical transducer used as an ultrasonic transducer or the like.

BACKGROUND ART

Recently, capacitive electromechanical transducers produced by a micromachining process have been actively studied. A typical capacitive electromechanical transducer includes a lower electrode, a vibrating membrane supported above the lower electrode with a certain distance therebetween, and an upper electrode provided on the surface of the vibrating membrane. Such a transducer is used as, for example, a capacitive micromachined ultrasonic transducer (CMUT), which is one form of a capacitive electromechanical transducer.

Such a capacitive micromachined ultrasonic transducer includes a lightweight vibrating membrane, which is vibrated by applying an electric field of a certain frequency between the upper electrode and the lower electrode. Thus, the capacitive micromachined ultrasonic transducer can transmit ultrasonic waves. On the other hand, when the vibrating membrane is vibrated by ultrasonic waves, the transducer receives the ultrasonic waves by detecting a change in the capacitance between the upper electrode and the lower electrode, and the ultrasonic waves can be taken out as electrical signals. Such capacitive micromachined ultrasonic transducers that exhibit good broadband characteristics even in liquids and air can be easily obtained. If such CMUTs are applied to, for example, the medical field, medical diagnosis with an accuracy higher than that of existing medical diagnosis can be realized, and thus the CMUTs have attracted attention as a promising technology.

Next, the principle of operation of a capacitive electromechanical transducer will be described. In transmitting elastic waves (typically ultrasonic waves), an alternating current (AC) potential (voltage) superimposed on a direct current (DC) potential (voltage) is applied between a lower electrode which is a first electrode and an upper electrode which is a second electrode. By applying an electric field between the first electrode and the second electrode in this manner, the vibrating membrane is vibrated by an electrostatic force that acts between the first electrode and the second electrode to generate elastic waves including ultrasonic waves. On the other hand, in receiving ultrasonic waves, since the vibrating membrane is deformed by the ultrasonic waves, signals are detected by a change in the capacitance between the lower electrode and the upper electrode, the change being caused by the deformation. Mechanical energy and electrical energy can be converted from one to the other by the principle described above. The theoretical sensitivity of such a capacitive electromechanical transducer is inversely proportional to the square of the distance (also referred to as "gap") between the electrodes. In order to manufacture a transducer with high sensitivity, the gap is controlled to be 100 nm or less.

In a typical method for forming a gap of a capacitive electromechanical transducer, a sacrificial layer having a thickness equal to a desired distance between electrodes is formed, a vibrating membrane is formed on the sacrificial layer, and the sacrificial layer is then removed. Such a technique is disclosed in PTL 1 and NPL 1.

CITATION LIST

Patent Literature

PTL 1: U.S. Pat. No. 6,426,582

Non Patent Literature

NPL 1: IEEE Transactions on Ultrasonics, Ferroelectrics and Frequency Control, Vol. 52, No. 12, December 2005, pp. 2242-2258.

SUMMARY OF INVENTION

Technical Problem

As described above, in order to increase the electromechanical conversion efficiency of the capacitive electromechanical transducer, the distance between the electrodes is reduced (for example, 100 nm or less).

However, in order to decrease the gap between the electrodes, the thickness of the sacrificial layer must be reduced in accordance with the gap. When the thickness of the sacrificial layer is reduced, it is considerably difficult to remove the sacrificial layer (composed of, for example, silicon (Si), silicon dioxide ($SiO_2$), or a metal). The reason for this is as follows. In order to etch the sacrificial layer provided between the electrodes, it is necessary that an etching reaction between an etching solution and the sacrificial layer be caused. When the gap between the electrodes is smaller than a certain distance, the etching solution does not tend to permeate into the gap between the electrodes. Furthermore, when a gas such as hydrogen is generated during the etching reaction, it takes a longer time for the etching solution to permeate. Furthermore, as described in PTL 1, it takes several days to about one week to perform an etching step at low temperatures. In such a case, when a capacitive electromechanical transducer is immersed in an etching solution for a long time, the vibrating membrane of the capacitive electromechanical transducer is damaged by the etching solution. Consequently, the yield may be decreased.

On the other hand, the etching rate can be increased to some extent by increasing the temperature of an etching solution. However, when an etching reaction is accelerated by this method, a vibrating membrane, which has a low mechanical strength, is broken by bubbles formed during the etching reaction at a high temperature. Consequently, the yield may be decreased. Thus, in the case of etching of a sacrificial layer having a large area and provided in a small gap formed between electrodes, the productivity is low because of diffusion limitation of the etching solution. Accordingly, realization of high-speed etching has been desired. Meanwhile, in order to etch a sacrificial layer, it is necessary to form an inlet of an etching solution. As the size of the inlet of the etching solution increases and the number of inlets increases, that is, as the exposed region of the sacrificial layer increases, the etching rate increases. However, when a large hole or a large number of holes are provided, as an inlet of an etching solution, in the mechanical structure of a micromachined electromechanical transducer, the performance of the inherent mechanical structure is adversely affected. As a result, the design performance, lifetime, stability, and reliability of the transducer may be impaired. For example, providing a large hole or a large number of holes in a vibrating membrane of a capacitive electromechanical transducer significantly affects the vibration mass, stress of a vibrating portion, vibration frequency, vibrating node, vibration displacement, and the like. For this reason, the size of the inlet of an etching solution and the number of inlets are minimized in such a capacitive electromechanical transducer.

In another conceivable method for etching a sacrificial layer, a magnetic field is applied in a direction perpendicular to a direction of the current supplied to an etching solution during etching of the sacrificial layer provided between upper and lower electrodes. However, in this method, a surface of the sacrificial layer exposed to the etching solution (i.e., inlet of the etching solution) is located on a side face, and exposure to a wide area and in a plurality of directions is necessary. When the number of inlets of the etching solution is small or when the size of the inlet is small, the advantage of this method is limited.

Furthermore, when the distance between the upper and lower electrodes is small and a transducer is taken out from an etching solution, the upper electrode and the lower electrode adhere to each other due to the surface tension of the liquid, and in-plane variations in the transducer characteristics may be generated on a substrate by a so-called sticking phenomenon.

Solution to Problem

The present invention has been completed as a result of intensive studies conducted in order to solve the above problems. The present invention provides a method for manufacturing a capacitive electromechanical transducer that converts between mechanical energy and electrical energy by means of a displacement of a vibrating membrane, the method including the steps of forming a first electrode on a substrate; forming a sacrificial layer on the first electrode; forming a vibrating membrane on the sacrificial layer, the vibrating membrane being provided with a second electrode; forming an opening that communicates the sacrificial layer with the outside; and forming a cavity by electrolytically etching the sacrificial layer in an electrolyte solution by applying an electric field between the first electrode and a third electrode provided outside, wherein the sacrificial layer is composed of an electrically conductive material having a smaller dissolution potential than the dissolution potential of the first electrode, and an electric potential applied between the first electrode and the third electrode in the step of forming the cavity is larger than the dissolution potential of the sacrificial layer and is smaller than the dissolution potential of the first electrode.

Advantageous Effects of Invention

According to the method of the present invention, since an opening portion or an opening is formed as described above, the sacrificial layer can be etched at a relatively high etching rate without depending on diffusion limitation, thus satisfactorily forming a cavity. Furthermore, even when the size or the number of the opening portion or the opening is not increased, a constant etching rate or a high, constant, and stable etching rate can be realized by an anode potential (voltage) of the first electrode. Accordingly, even in a capacitive electromechanical transducer (e.g., CMUT) having a large area or an array capacitive electromechanical transducer having a plurality of transducer portions, productivity (e.g., the yield, and the reduction in the manufacturing time) and performance thereof (e.g., uniformity of the transducer performance, and the sensitivity of the transducer) can be improved.

DESCRIPTION OF EMBODIMENT

A capacitive electromechanical transducer of the present invention converts between mechanical energy and electrical energy by means of a displacement of a vibrating membrane.

Figure 1:
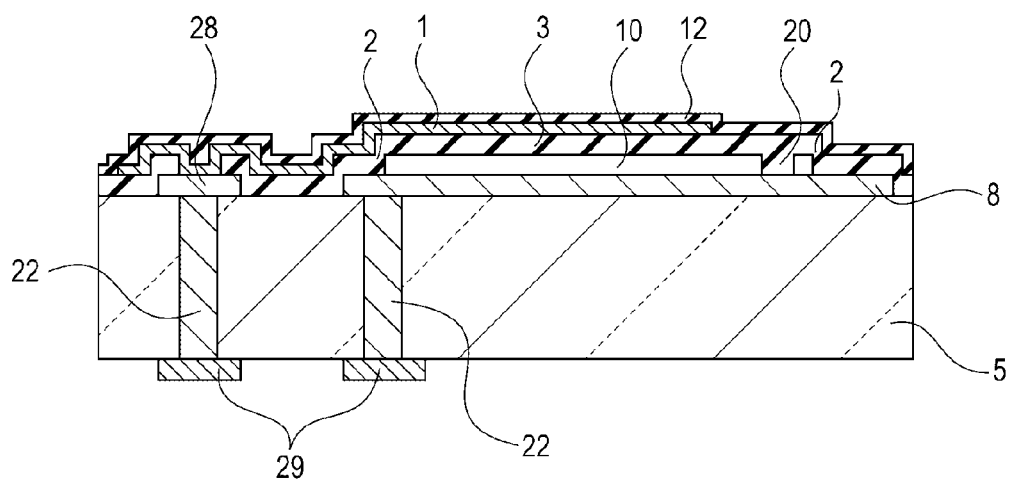
FIG. 1 is a cross-sectional view showing an example of a capacitive electromechanical transducer.

FIG. 1 is a cross-sectional view showing the basic structure of a transducer obtained by a method for manufacturing a capacitive electromechanical transducer of the present invention. A lower electrode 8 which is a first electrode is provided on a substrate 5, and vibrating membrane-supporting portions 2 are provided on the lower electrode 8. The vibrating membrane-supporting portions 2 support a vibrating membrane 3, and the vibrating membrane 3 is fixed to the substrate 5 through the supporting portions 2. A cavity (space) 10 is formed by being surrounded by the substrate 5, the vibrating membrane 3, and the vibrating membrane-supporting portions 2. In this embodiment, the lower electrode 8 is provided so that at least a portion of the lower electrode 8 is exposed to the cavity 10.

When the substrate 5 is composed of an insulating material (e.g., glass), through-wiring conductive portions 22 that penetrate the substrate 5 and electrode pads 29 that are electrically connecting portions disposed on the reverse face of the substrate 5 may be provided. In this case, as shown in FIG. 1, the lower and upper electrodes can be led to the reverse face of the substrate 5 through wiring. Alternatively, the lower and upper electrodes can be led to the top surface of the substrate 5 through wiring. In FIG. 1, wiring of the upper and lower electrodes and electrode pads thereof are omitted. Furthermore, an upper electrode 1 is provided on the upper surface of the vibrating membrane 3. The upper electrode 1 is formed so as to face the lower electrode 8 with the insulating vibrating membrane 3 therebetween, thus constituting the capacitive electromechanical transducer of this embodiment. To increase the conversion factor between mechanical energy and electrical energy of the capacitive electromechanical transducer, a DC bias voltage can be applied between the upper electrode 1 and the lower electrode 8 during operation. Because of the action of this DC bias voltage, electrostatic attraction pulls the upper electrode 1 toward the lower electrode 8 side. As a result, a downward displacement occurs at the central portion of the vibrating membrane 3. However, once the DC bias voltage exceeds a certain voltage, the vibrating membrane 3 is broken down and contacts the lower electrode 8 (collapses), and the electromechanical conversion factor may decrease rather than increase. This certain voltage is referred to as a collapse voltage. In the case where driving in a collapse state (collapse driving) is not performed, the bias voltage is adjusted so that such collapse does not occur. Therefore, when the upper electrode 1 is formed on the lower surface of the vibrating membrane 3, it is necessary to form an insulating film on a surface of the upper electrode 1, the surface facing the lower electrode 8, or on the lower electrode 8. That is, to prevent a short circuit between the upper electrode and lower electrodes, it is necessary to provide an insulating dielectric material between the upper and lower electrodes.

In the present invention, a sacrificial layer is formed of an electrically conductive material having a dissolution potential smaller than that of the first electrode (lower electrode 8) which is an electrode provided on the substrate. In addition, a potential applied between the first electrode and a third electrode (external electrode) in a step of forming the cavity is larger than the dissolution potential of the sacrificial layer and is smaller than the dissolution potential of the first electrode. According to this configuration, the sacrificial layer is selectively etched within a short time during electrolytic etching. Herein, the external electrode is an electrode arranged outside the cavity so as to face the cavity with the first electrode and the sacrificial layer therebetween. In this case, an opening portion for etching the sacrificial layer, the opening potion communicating with the outside, can be provided at an adequate position of a wall surface forming the cavity, e.g., in the vibrating membrane or in a sidewall of the cavity.

Unless the above-mentioned relationship between the dissolution potentials of the electrode material and the sacrificial layer and the potential applied during electrolytic etching is satisfied, it is difficult to selectively etch the sacrificial layer during electrolytic etching within a short time. For example, when the potential (potential applied between the first electrode and the third electrode) during the electrolytic etching is smaller than the dissolution potential of the sacrificial layer, the etching of the sacrificial layer does not proceed. In the case where the dissolution potential of the first electrode is smaller than the dissolution potential of the sacrificial layer, when the etching of the sacrificial layer proceeds and an etching solution reaches the first electrode, etching of the first electrode preferentially proceeds rather than etching of the sacrificial layer.

The sheet resistance of the lower electrode 8 is preferably 20.0 ohm/square or less, more preferably 5.0 ohm/square or less, and most preferably 1.0 ohm/square or less.

The material of the lower electrode 8 can be titanium (Ti). The dissolution potential (also referred to as "dissolution voltage") of Ti is sufficiently large. For example, when the concentration of a saline solution used as an electrolyte solution is 5 M (mol/L), the dissolution potential of Ti is 18 V. Accordingly, the potential applied between the electrodes during electrolytic etching can be controlled over a sufficiently wide range of voltage. However, the oxidation potential of Ti is about 4 V, and therefore, in the case where an etching reaction of the sacrificial layer is adversely affected by the formation of an oxide film on a surface of the Ti electrode, the etching reaction can be conducted at a potential of 4 V or less.

The material of the lower electrode 8 is not limited to metallic Ti, and other low-resistance materials can also be used so long as the relationship between the dissolution potentials of the electrode material and the sacrificial layer and the potential applied during electrolytic etching is satisfied. Examples of the material of the lower electrode 8 include doped single-crystal silicon (Si) substrates, single-crystal Si substrates including a doped well region functioning as a lower electrode, doped amorphous Si, doped polycrystalline Si, metals having a larger dissolution potential than that of a sacrificial layer 11 described below, and oxide semiconductors.

The dissolution potential of Si is −5 V or less. Therefore, a single-crystal Si substrate itself can be used as the lower electrode 8 when a sacrificial layer composed of a metal (such as aluminum (Al), copper (Cu), or chromium (Cr)) is etched. When the lower electrode 8 is composed of Si, the Si is not etched under the voltage condition in a range of the dissolution potential of the above sacrificial layer.

When the substrate 5 is used as the lower electrode 8 (i.e., when the substrate also functions as the lower electrode), the series resistance in transducer circuits may be decreased in order to increase a sensing current of the transducer. In order to increase the rate of the electrolytic etching and to facilitate charge transfer, the Si substrate used as the lower electrode 8 may be doped with an impurity to form the lower electrode 8 having a low resistance. In such a case, the surface impurity concentration is preferably $10^{14}$ $cm^{-3}$ or more, more preferably $10^{16}$ $cm^{-3}$ or more, and most preferably $10^{18}$ $cm^{-3}$ or more. In this case, the upper limit of the impurity concentration is not particularly limited so long as other properties are not adversely affected.

Furthermore, when a Si substrate is used, a P-type Si substrate is suitably used in order to provide holes. Therefore, the doping source of the impurity can be boron (B), gallium (Ga), or the like. The surface roughness of the lower electrode 8 may be increased in some cases because the crystallinity of the electrode changes depending on the thermal history of the process. The surface roughness of the lower electrode 8 is proportional to the thickness of the lower electrode 8. If the surface roughness of the lower electrode 8 is too large, electrical discharge may occur when a bias voltage is applied to the transducer. Therefore, it is necessary to control the thickness of the lower electrode 8 to be in an appropriate range. According to the knowledge of the inventors of the present invention, the thickness of the lower electrode 8 is preferably in the range of 10 to 500 nm. In order to further increase the electrical conductivity and process stability, the thickness of the lower electrode 8 is preferably in the range of 50 to 200 nm.

When the vibrating membrane 3 is formed on the sacrificial layer, it is important that the sacrificial layer be not oxidized in the step of forming the vibrating membrane 3. This is because if the sacrificial layer is oxidized in the step of forming the vibrating membrane 3, the surface roughness of the sacrificial layer is significantly increased. This surface roughness is reflected on the vibrating membrane 3 that contacts the sacrificial layer, and the upper electrode 1 and increases the surface roughness of the vibrating membrane 3 and the upper electrode 1. As a result, defects, cracks, and the like may be generated in the vibrating membrane 3, and furthermore, leakage-current of the upper electrode 1 may increase. Accordingly, in the step of forming the vibrating membrane 3, the temperature of the atmosphere of the sacrificial layer is preferably in the range of 200 to 400 degrees Celsius. Furthermore, when the vibrating membrane 3 is formed by depositing silicon nitride (SiN) by plasma chemical vapor deposition (CVD), it is necessary to perform the plasma CVD process under a condition in which the sacrificial layer is not oxidized.

In addition, it is necessary that the dissolution potential of the sacrificial layer be smaller than that of Ti. For example, chromium (Cr) can be selected as the sacrificial layer because the dissolution potential of Cr is about 0.75 V. The voltage applied for dissolving the Cr sacrificial layer during electrolytic etching is preferably set in the range of 0.75 to 4 V, which is larger than the dissolution potential of the sacrificial layer and smaller than the dissolution potential of the first electrode. The voltage applied is more preferably in the range of 2 to 3 V because the etching rate increases.

Note that, theoretically, the conversion factor of this electromechanical transducer is inversely proportional to the square of the distance between the upper and lower electrodes. Accordingly, the smaller the thickness of the sacrificial layer, the higher the conversion performance of the electromechanical transducer. On the other hand, with the decrease in the thickness of the sacrificial layer, the distance between the vibrating membrane and the bottom of the cavity (the bottom of the substrate may also function as the lower electrode) decreases. Accordingly, sticking of the vibrating membrane may occur in some cases. Therefore, the thickness of the sacrificial layer is preferably in the range of 20 to 500 nm, more preferably in the range of 50 to 300 nm, and most preferably in the range of 100 to 200 nm.

In the present invention, in order to suppress sticking generated in the case where the upper electrode contacts the lower electrode by the collapse described above (including the case where the upper electrode contacts the lower electrode with an insulating layer therebetween), the electromechanical transducer may have the following configuration, as needed. Specifically, fine particles composed of an oxide film of a substance forming the first electrode are arranged on the surface of the first electrode as a structure for buffering. If the diameter of the fine particles is too large, the fine particles contact the vibrating membrane during normal vibration of the vibrating membrane and adversely affect the vibration. If the diameter of the fine particles is too small, sticking cannot be effectively suppressed. Accordingly, the diameter of the fine particles is preferably in the range of 2 to 200 nm.

The capacitive electromechanical transducer of the present invention can be manufactured by the following method. In FIG. 1, the lower electrode 8, which is the first electrode, is formed on the substrate 5, and a sacrificial layer is then formed on the first electrode. The vibrating membrane 3 provided with the upper electrode 1, which is the second electrode, is then formed on the sacrificial layer. Subsequently, an opening communicating with the sacrificial layer and the outside of a cavity is formed as an inlet of an etching solution in a portion (typically, the vibrating membrane) of a sidewall surrounding the sacrificial layer (region to be formed into the cavity). Next, an electric field is applied in an electrolyte solution between the first electrode and an external electrode (third electrode) provided outside through the opening, whereby the sacrificial layer is removed by electrolytic etching to form the cavity. In this step, the region of the sacrificial layer may be completely included within the region of the first electrode to which the electric field is applied. In this case, since the electric field is uniformly or efficiently applied to the region to be electrolytically etched, etching can be efficiently performed. Thus, the sacrificial layer is removed by etching to form the cavity 10. The opening serving as the inlet of the etching solution is then sealed to seal the cavity 10. A capacitive electromechanical transducer including a plurality of such transducer portions can be manufactured by the following method. Specifically, the transducer is configured so that at least a part of the sacrificial layer of a first transducer portion is connected to at least a part of the sacrificial layer of a second transducer portion, the first transducer portion and the second transducer portion being disposed adjacently or close to each other. Subsequently, an opening communicating with the outside and either the part of the sacrificial layer to be formed into the cavity of the first transducer portion or the part of the sacrificial layer to be formed into the cavity of the second transducer portion is formed. An electric field is then applied between the external electrode (third electrode) and the second electrode which is the lower electrode through the opening. As a result, the first electrode, the sacrificial layers of the parts of the cavities of the first and second transducer portions, and the sacrificial layer connecting these portions are continuously removed by etching. Thus, the sacrificial layer connecting the first transducer portion to the second transducer portion is removed by etching in the step of electrolytic etching, and the portion from which the sacrificial layer has been removed functions as a flow path of an etching solution, the flow path connecting the cavity of the first transducer portion to the cavity of the second transducer portion. Consequently, by forming the opening communicating with a sacrificial layer to be formed into either the cavity of the first transducer portion or the cavity of the second transducer portion, the cavity of the first transducer portion and the cavity of the second transducer portion can be formed at one time. In this case, the region of the sacrificial layer can be completely included within the region of the first electrode to which the electric field is applied.

According to the method of this embodiment, the sacrificial layer can be etched at a relatively high etching rate without depending on diffusion limitation, and a cavity having a sufficiently small thickness can be satisfactorily formed.

In addition, the generation of bubbles is suppressed to prevent the vibrating membrane from damaging. Furthermore, even when the size or the number of the opening portion or opening is not increased, a constant etching rate or a high, constant, and stable etching rate can be realized by an anode voltage of the first electrode. Accordingly, even in a capacitive electromechanical transducer having a large area or an array capacitive electromechanical transducer, a reduction in the manufacturing time, uniformity of the transducer performance, an increase in the sensitivity of the transducer, improvement of the yield, and the like can be realized. In the present invention, the electrolytic etching solution is not limited to a saline solution (aqueous sodium chloride (NaCl) solution), and other electrolyte solutions, for example, solutions containing sodium bromide (NaBr), sodium perchlorate (NaClO$_4$), sodium hydroxide (NaOH), sodium nitrate (NaNO$_3$), or the like can also be used. In general, an etching solution is a strong acid or a strong alkali, and therefore, a lower electrode may be damaged because of a limited etching selection ratio. Accordingly, a method in which the lower electrode is covered with a protective film is often employed. However, the formation of this protective film increases the distance between the upper and lower electrodes and may decrease the sensitivity of the capacitive electromechanical transducer. In contrast, according to the present invention, since an etching solution having a neutral pH can be used, the lower electrode is not damaged. Furthermore, since such a protective film is not provided, the distance between the upper and lower electrodes can be decreased to increase the sensitivity of the capacitive electromechanical transducer.

In view of the cost, an aqueous NaCl solution is more inexpensive than other etching solutions. In addition, the use of NaCl is advantageous in that, for example, a simple etching apparatus can be used, contamination is low, and hazardousness of a solution thereof is also low. To provide chlorine ions that are necessary for the electrolytic etching reaction, the concentration of the NaCl solution is preferably 0.01 M (mol/L) or more and the saturated concentration or less, and more preferably 0.2 M or more and 2.5 M or less at room temperature. In the present invention, the final distance between the electrodes (distance between the lower electrode 8 and the upper electrode described below) of the transducer is determined by the thickness of the sacrificial layer 11. The smaller the thickness of the sacrificial layer 11, the larger the electromechanical conversion factor of the transducer. However, when the distance between the electrodes is too small, the risk of dielectric breakdown increases. From the standpoint of the electrolytic etching and a subsequent drying step, the thickness of the sacrificial layer 11 is preferably in the range of 5 to 4,000 nm, more preferably in the range of 10 to 1,000 nm, and most preferably in the range of 20 to 500 nm.

In the present invention, in performing plasma CVD, the pressure during the step of deposition is preferably in the range described below. For example, when sealing is performed with a silicon nitride (represented by SiN$_x$) film formed by plasma CVD, the vibrating membrane 3 is deformed by the atmospheric pressure in the downward direction to have a concave shape. Accordingly, the pressure in the sealed cavity 10 is preferably in the range of 1 to 70,000 Pa, more preferably 10 to 15,000 Pa, and most preferably 20 to 3,000 Pa.

In the present invention, the stress of the silicon nitride film deposited by plasma CVD can be controlled by the arrangement of discharge electrodes of a plasma CVD deposition apparatus, the discharge frequency, the gas composition, and the temperature. When this stress is compressive, a buckling phenomenon readily occurs and the vibrating membrane 3 may be deformed to have a convex shape. FIG. 3H shows a horizontal state of the vibrating membrane 3. Accordingly, the internal residual stress of the vibrating membrane 3 including a sealing film is preferably in the range of −200 to +200 MPa, more preferably −100 to +100 MPa, and most preferably −50 to +50 MPa.

EXAMPLES

The present invention will now be described in more detail by way of Examples. However, the present invention is not limited to the description described below.

Example 1

The dissolution potential of metals will be described by way of electrolytic etching. Four types of metal films (with a thickness of 200 nm), namely, aluminum (Al), copper (Cu), chromium (Cr), and titanium (Ti) films are deposited on Pyrex (registered trademark) glass substrates by an electron beam method. Each of the substrates with the metal films is then locally immersed in a 2 M saline solution which is an electrolyte solution. Next, a part of each metal film that is not immersed in the electrolyte solution is connected to a working electrode of a potentiostat. In Examples of the present invention, a potentiostat HZ-5000 (Hokuto Denko Corporation) is used. A reference electrode composed of Ag/AgCl and a counter electrode composed of platinum (Pt) are also immersed in the electrolyte solution. Thereafter, the same potentiostat, reference electrode, and counter electrode are used in electrolytic etching. Electrolytic etching experiments described below are conducted at room temperature.

Next, the potential of the working electrode is swept with a voltage sweeper. The potential of the working electrode is set to a potential 1 V lower than the self-potential, is increased to a certain potential, and lastly returned to the self-potential. The results are shown in electrolysis I-V curves of FIGS. 2A to 2D. In FIGS. 2A to 2D, the horizontal axis represents the voltage applied to the working electrode, and the vertical axis represents the current flowing from the working electrode.

Figure 2A:
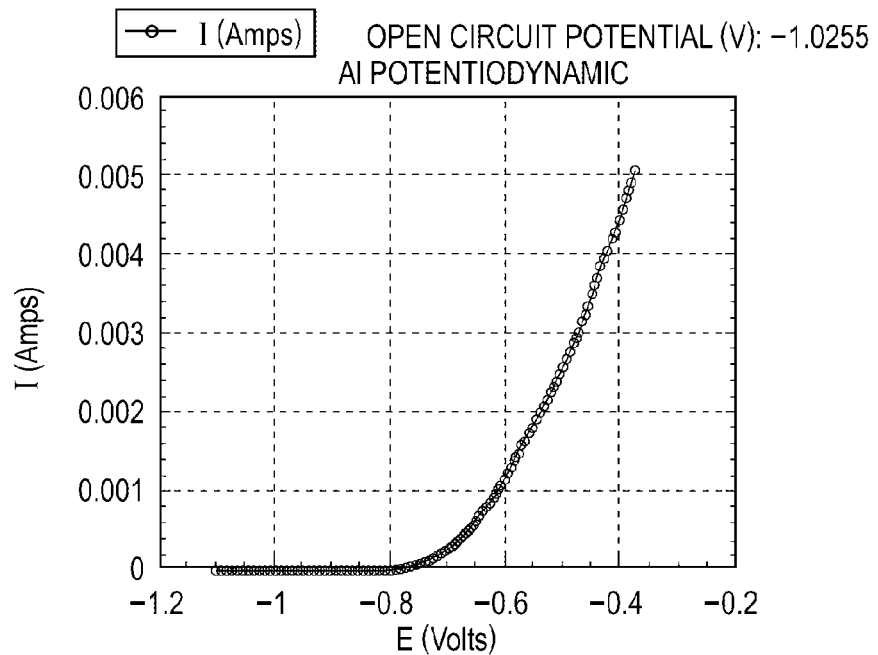
FIG. 2A is a characteristic curve showing the relationship between the current and the voltage when aluminum was used as a working electrode.

As shown in FIG. 2A, in the case of aluminum, the current does not substantially flow in the range of about −0.7 V or less. The current rapidly increases from −0.7 V or more. That is, an electrolytic reaction is activated in the range of −0.7 V or more, and aluminum is etched.

In the present invention, the term "dissolution potential" means a potential immediately before the current rapidly increases (potential at which the current starts to rapidly increase) when the potential applied to the working electrode is swept from a negative value to a positive value. In the present invention, the phrase "rapid increase in the current" means that the current increases to a value larger than the current generated at the self-potential by two or more orders of magnitude. In the above description, the dissolution potential of aluminum is −0.7 V.

Figure 2B:
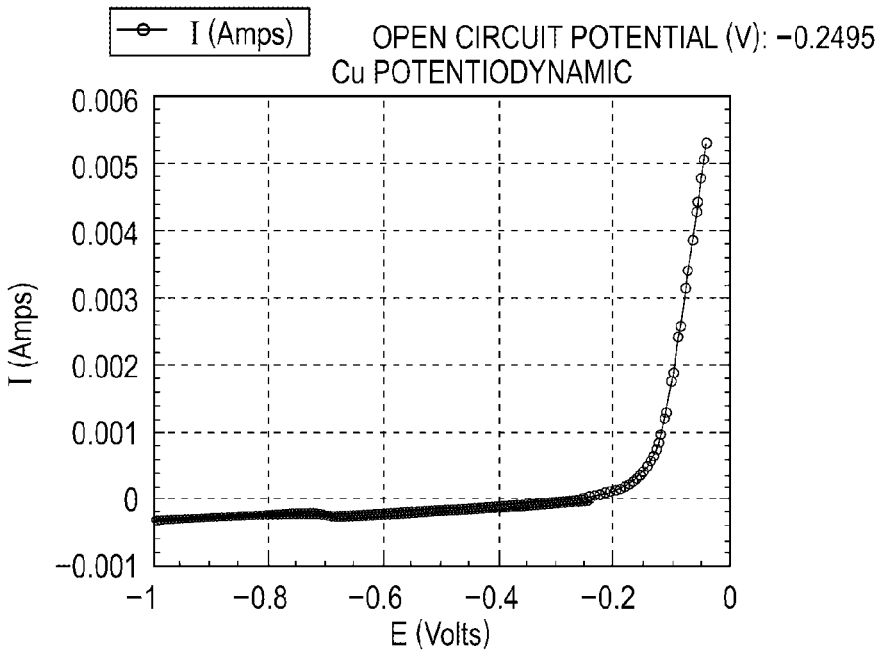
FIG. 2B is a characteristic curve showing the relationship between the current and the voltage when copper was used as a working electrode.
Figure 2C:
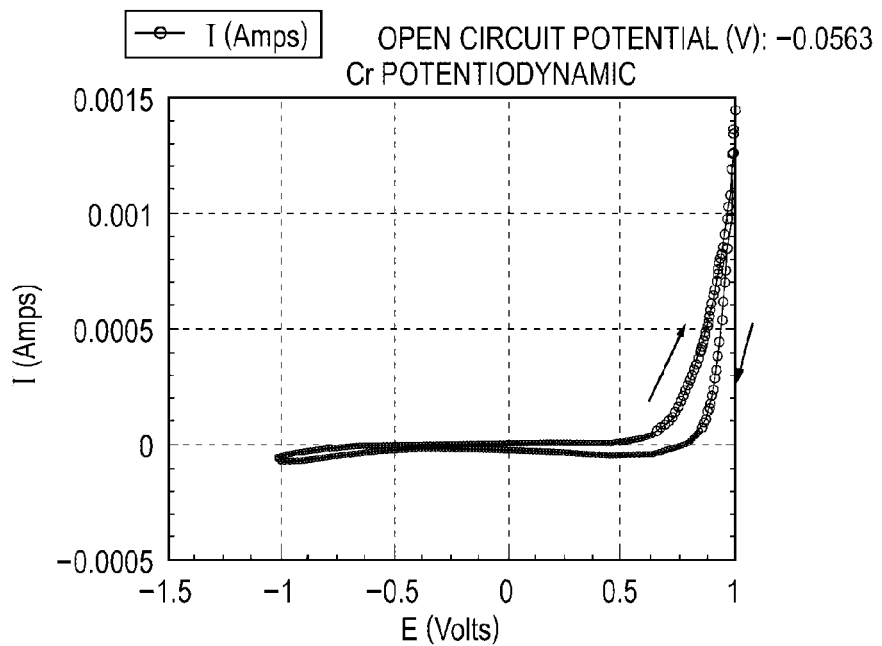
FIG. 2C is a characteristic curve showing the relationship between the current and the voltage when chromium was used as a working electrode.
Figure 2D:
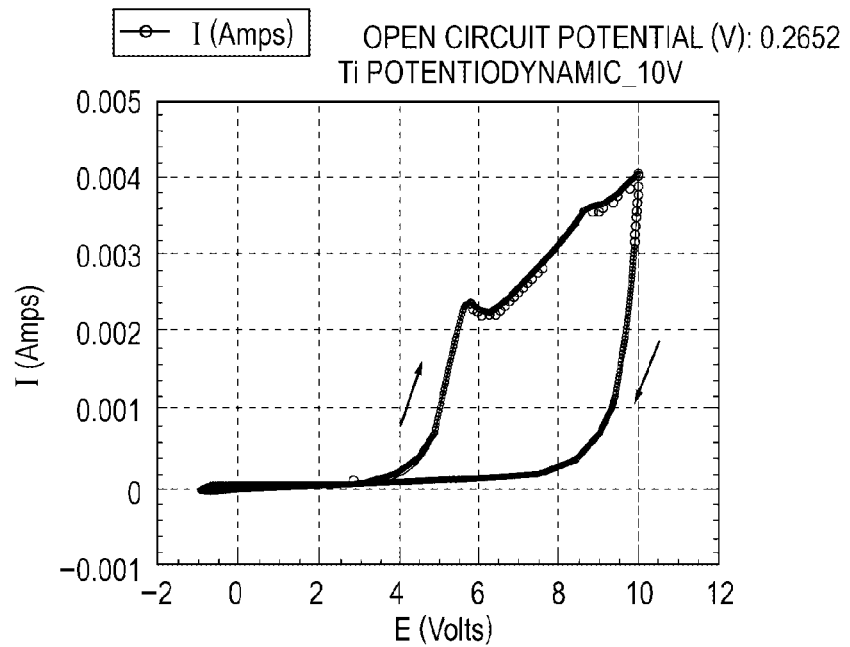
FIG. 2D is a characteristic curve showing the relationship between the current and the voltage when titanium was used as a working electrode.

Similarly, as shown in FIG. 2B, the dissolution potential of copper is −0.25 V. When a voltage equal to or higher than −0.25 V is applied, elution of blue copper ions can be visually confirmed from a copper surface. Similarly, as shown in FIG. 2C, the dissolution potential of chromium is about +0.75 V. When a voltage equal to or higher than +0.75 V is applied, elution of yellowish green chromium ions can be visually confirmed from a chromium surface. In this case, the electrolysis I-V curve initially shows hysteresis characteristics, as shown in FIG. 2C. However, when the sweeping is repeated 30 times, substantially the same curve is observed with good repeatability. According to this result, it is confirmed that chromium is dissolved from a potential of about +0.75 V (the dissolution potential of chromium is +0.75 V). Note that when the maximum voltage of the sweeping is +1 V, the electrolysis I-V curve of titanium shows substantially zero, and no electrolytic reaction is observed. When the maximum voltage is set to +10 V and sweeping is performed, a hysteresis phenomenon is observed as shown in FIG. 2D. In this case, an electrolytic reaction occurs from about +4 V, and a brown substance is formed on a titanium surface. Since the resistance of the titanium surface measured with a tester is very high, it is believed that the brown substance is an oxide of titanium. When the maximum voltage is further increased, the color of the oxide changes to purple but the hysteresis phenomenon is similarly observed. This result shows that the surface of titanium does not dissolve and a passive oxide is formed even when the voltage is changed.

Although drawings are omitted, dissolution of gold (Au) occurs in the range of about +1.1 V or more under the above condition of the saline solution (electrolyte solution) at room temperature. Similarly, dissolution of single-crystal silicon occurs in the range of about −5 V or less.

Furthermore, when a potential (voltage) higher than the dissolution potential of each metal (Al, Cu, or Cr) on the Pyrex (registered trademark) glass substrate is applied, it is confirmed that the metal (Al, Cu, or Cr) is dissolved (etched) by an oxidation reaction. However, the part immersed in the electrolyte solution (saline solution) is not completely etched, and unetched regions are scattered in the form of island. The reason for this is believed to be as follows. Island-like metal regions are formed by in-plane variations in an etching reaction. As a result, a supply path of holes (positive holes) necessary for electrolytic etching (oxidation reaction) is interrupted, thereby stopping the etching. To prevent this phenomenon, a single titanium film (thickness: 50 nm) is provided between the aluminum, copper, or chromium film and the Pyrex (registered trademark) glass substrate, and the electrolytic etching voltage is set to be in the range of 0.75 to 3 V. As a result, the part of the metal film immersed in the electrolyte solution (saline solution) is sufficiently etched, and no island-like unetched regions remain.

When an electric conductor is completely etched by electrolysis, it is necessary not only to control the potential to be larger than the dissolution potential of the electric conductor but also to form a path for providing holes necessary for oxidation reaction. For example, it is necessary that another electric conductor film be provided so as to be in contact with the electric conductor to be etched. Furthermore, in order to selectively etch these two electric conductor films by electrolysis, it is important that the electrolytic etching is performed with a potential larger than the dissolution potential of the electric conductor to be etched and is smaller than the dissolution potential of the other electric conductor that provides holes.

In order to ensure the supply path of holes, the region of the electric conductor to be etched may be completely included within the region of the other electric conductor that provides holes.

In the above case, generation of bubbles with a diameter in the range of about 0.1 to 1 mm may be observed on a surface of the platinum counter electrode, and the bubbles are believed to be hydrogen generated by reductive reaction. In particular, the electric conductor connected to the working electrode is very important in the method for manufacturing a capacitive electromechanical transducer according to the present invention because the generation of bubbles is suppressed during the electrolytic etching process. With respect to the above electrolytic etching conditions, the following steps will be further described. FIGS. 3A to 3K are cross-sectional views illustrating steps of a method for manufacturing a capacitive electromechanical transducer according to Example 1 of the present invention. In the description below, the term "patterning process" means all steps including a photolithographic steps such as application of a photoresist onto a substrate, drying, exposure, and development, an etching step, a step of removing the photoresist, a step of cleaning the substrate, and a drying step, the steps being performed in this order. A silicon (Si) substrate is used as a substrate 4 in this Example, but substrates composed of other materials can also be used. For example, a substrate composed of $SiO_2$, sapphire, or the like can also be used.

Figure 3A:
FIG. 3A is a cross-sectional view showing a step of a method for manufacturing a capacitive electromechanical transducer according to Example 1 and an embodiment of the present invention.
Figure 3B:
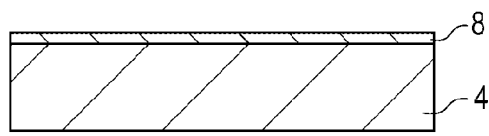
FIG. 3B is a cross-sectional view showing a step of the method according to Example 1 and the embodiment of the present invention.

In the method of this Example, first, as shown in FIG. 3A, a Si substrate 4 (for example, P-type, orientation: (100), resistivity: 1 to 20 ohm-cm, diameter: 4 inches) is prepared and cleaned. Next, as shown in FIG. 3B, a titanium (Ti) layer serving as a lower electrode 8 is deposited on a surface of the Si substrate 4 by a splutttering method. Since this Ti layer has a function of supplying holes in an electrolytic etching reaction described below, the rate of the electrolytic etching significantly depends on the resistance of the Ti layer. Note that this Ti layer also has a function of supplying a current in a certain frequency range as a lower electrode of the present invention. The Ti layer is patterned with an etching solution containing hydrofluoric acid, and thus the thickness of the Ti layer serving as the lower electrode 8 is preferably in the range of 10 to 1,000 nm, and most preferably in the range of 50 to 500 nm.

Furthermore, in order to achieve a uniform, stable, and high etching rate in the electrolytic etching of a sacrificial layer in a subsequent step, it is preferable to reduce the voltage drop due to the lower electrode 8. For this purpose, although a specific region serving as the lower electrode 8 is not illustrated in FIG. 3B, deep reactive ion etching (DRIE) of the substrate 4 may be performed so as to electrically separate a transducer.

Figure 3C:
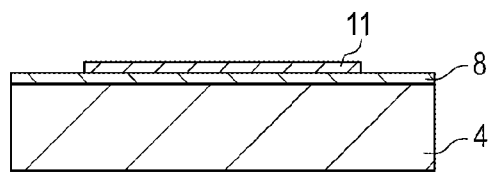
FIG. 3C is a cross-sectional view showing a step of the method according to Example 1 and the embodiment of the present invention.

Next, as shown in FIG. 3C, a metallic chromium (Cr) film (thickness: 200 nm) serving as a sacrificial layer 11 is deposited by an electron-beam evaporation method. The Cr film is then patterned with an etching solution containing $(NH_4)_2Ce(NO_3)_6$.

It is preferable to reduce the voltage drop in the sacrificial layer 11 so as to obtain a uniform and stable etching rate when the sacrificial layer 11 is electrolytically etched in the subsequent step. Considering the dimensions of transducers that can be fabricated by a current micromachining technology, the resistivity of the sacrificial layer 11 is preferably $10^{-1}$ ohm-cm or less, more preferably $10^{-3}$ ohm-cm or less, and most preferably $10^{-5}$ ohm-cm or less. Accordingly, a metal is preferably used as the material for the sacrificial layer 11.

Figure 3D:
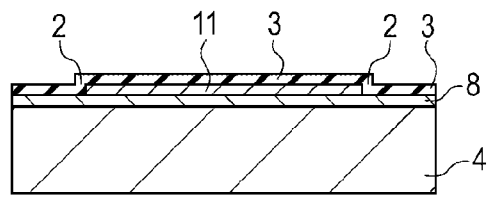
FIG. 3D is a cross-sectional view showing a step of the method according to Example 1 and the embodiment of the present invention.

Next, as shown in FIG. 3D, a silicon nitride ($SiN_X$) film (thickness: 500 nm) serving as a vibrating membrane 3 is deposited by a plasma CVD method. Vibrating membrane-supporting portions 2 are also formed at the same time owing to a difference in the height due to the sacrificial layer 11.

The vibrating membrane of the capacitive electromechanical transducer is a part of a dielectric material in the capacitive structure thereof, and thus the vibrating membrane 3 preferably has a high dielectric constant. For example, at least one dielectric material selected from a silicon nitride ($Si_XN_Y$) film, a silicon oxide (represented by $Si_XO_Y$) film, a silicon oxynitride (represented by $SiN_XO_Y$) film, and films composed of $Y_2O_3$, HfO, HfAlO, or BST [$(Ba, Sr)TiO_3$] is used as the vibrating membrane 3.

Figure 3E:
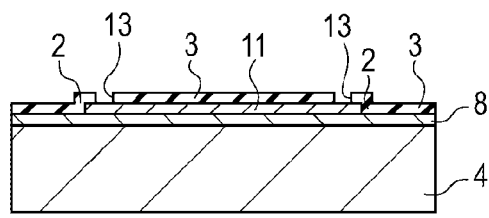
FIG. 3E is a cross-sectional view showing a step of the method according to Example 1 and the embodiment of the present invention.

Next, as shown in FIG. 3E, the $Si_3N_4$ film serving as the vibrating membrane 3 is patterned by reactive ion etching (RIE) using a $CF_4$ gas plasma to form openings in the vibrating membrane 3, the openings communicating with the sacrificial layer 11 and serving as inlets 13 of an etching solution. In this Example, the inlets 13 of the etching solution are provided at positions corresponding to the ends of the cavity, but the arrangement of the inlets 13 is not limited thereto. For example, the inlets 13 of the etching solution may be provided at positions a certain distance away from the cavity, and other flow paths may be provided between each of the inlets 13 and the cavity. When an etching stop layer in the etching is provided, chromium, which is difficult to be etched, is used from the standpoint of simplicity of the process.

Figure 3F:
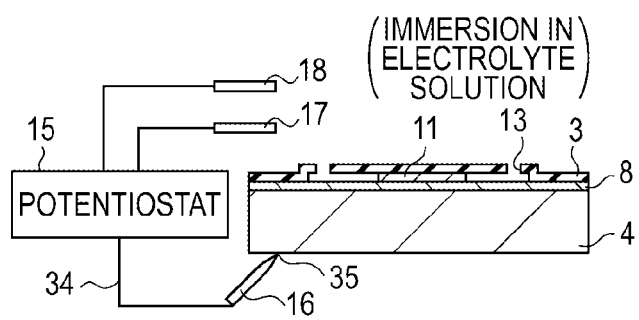
FIG. 3F is a cross-sectional view showing a step of the method according to Example 1 and the embodiment of the present invention.

Next, as shown in FIG. 3F, the reverse face of the electrically conductive substrate 4 is electrically connected to a working electrode 16 of a potentiostat 15. The sacrificial layer 11 is electrically connected to the working electrode 16 through the lower electrode 8 and the electrically conductive substrate 4. Thus, an electrically connecting portion 35 is formed. The position of the electrically connecting portion 35 is not limited to the reverse face of the electrically conductive substrate 4. Alternatively, the electrically connecting portion 35 may be formed on the top face of the substrate 4. In order to reduce the contact resistance of the electrically connecting portion 35, a single metal film, for example, a titanium film (thickness: 20 to 1,000 nm) can be provided on the reverse face of the substrate 4.

An insulating film for protection may be provided on the outer surface of this electrolytic etching portion so that the electrically connecting portion 35 is not etched during the electrolytic etching. For example, a silicone resin, a photoresist, or the like can be used as the insulating film. Alternatively, the reverse face of the substrate 4 and the electrically connecting portion 35 may be protected with a single-side protection jig for wet etching.

For example, materials such as platinum (Pt), nickel (Ni), and carbon (C) can be suitably used as a counter electrode 18.

In the present invention, since the sacrificial layer 11 (Cr) is composed of a low-resistance material, the amount of potential drop in the sacrificial layer 11 is relatively small. Accordingly, the potential of the sacrificial layer 11 is substantially the same as the potential of the lower electrode 8. Thus, an electrical circuit is formed in which the sacrificial layer 11 and the lower electrode 8 function as the anode and the counter electrode 18 functions as the cathode.

In this Example, a reference electrode 17 is disposed at a position about 1 mm away from the surface of the substrate 4, and the counter electrode 18 is also disposed so as to face the substrate 4 at a position about 10 mm away from the surface of the substrate 4.

After the above circuit configuration is provided, as shown in FIG. 3F, the substrate 4 whose reverse face is protected, the reference electrode 17, and the counter electrode 18 are immersed in a saline solution having a concentration of 2 M (mon), the saline solution being used as an electrolyte solution. A voltage is applied between the counter electrode 18 (cathode) and the lower electrode 8 through electric wiring 34 in an electrolytic etching solution by the potentiostat 15. Thus, an electrolytic etching reaction is initiated from the inlets 13 of the etching solution. When the sacrificial layer 11 is wetetched without using an electrolytic reaction, the etching is stopped by diffusion limitation within a short time. This phenomenon becomes significant when the thickness of the sacrificial layer is reduced because the cross-sectional area of the sacrificial layer is also reduced. However, according to the electrolytic etching method of this Example, the sacrificial layer 11 (Cr) can be selectively removed within a relatively short time.

Figure 4:
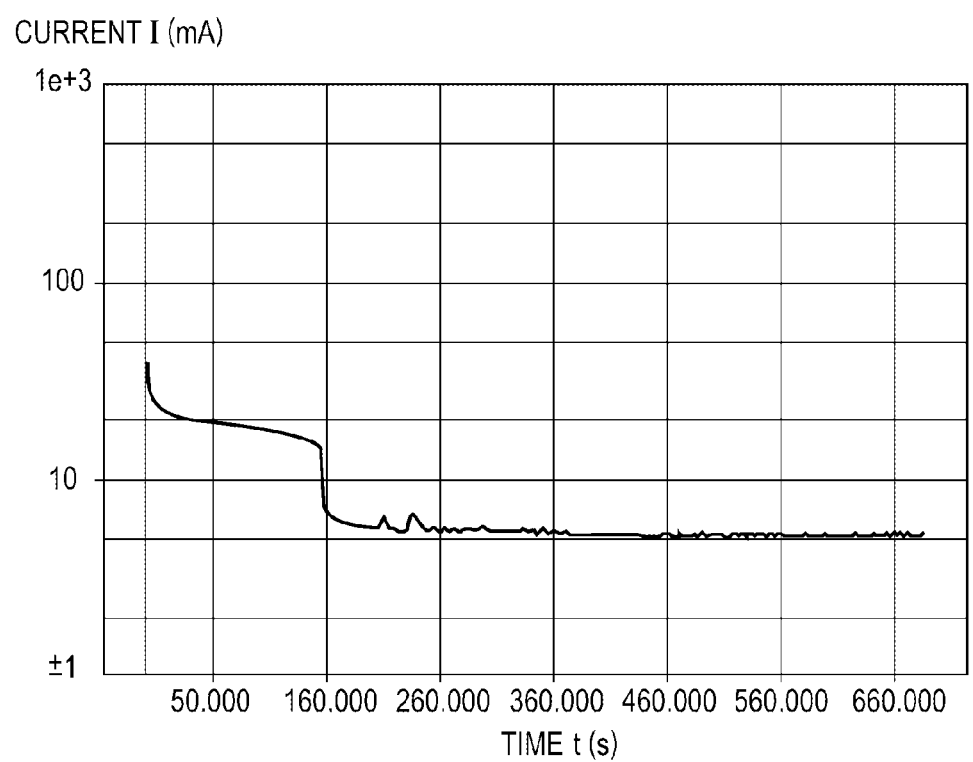
FIG. 4 is a graph showing the relationship between the current and the time in a step of electrolytic etching in Example 1.

A potential that is larger than the dissolution potential of the sacrificial layer 11 and is smaller than the dissolution potential of the lower electrode 8 is selected as the voltage applied to the electrodes during the electrolytic etching. Specifically, an electrolytic potential in the range of 0.75 V, which is the dissolution potential of the sacrificial layer 11 (Cr), to 4 V, which is the oxidation potential of the lower electrode 8 (Ti), is applied. For example, a sacrificial layer Cr pattern (Cr film thickness: 200 nm) in which 144 (12×12) portions each having a diameter of 70 micrometers are arranged in a 20 mm-square chip is etched with an electrolytic etching voltage of 2 V. In this case, a curve showing the relationship between the current and the time, the curve being measured by the potentiostat, is shown in FIG. 4. The reason why a large current flows at the initial moment is that an interface (Helmholtz layer) in which ions in the electrolyte solution are adsorbed on a surface of an electrode is formed. Subsequently, a substantially constant current flows and the electrolytic etching reaction stably proceeds. Subsequently, the current is rapidly decreased by about two orders of magnitude at about 160 seconds, and the completion of the etching of the sacrificial layer can be confirmed by optical microscopy. Since the sacrificial layer has been sufficiently etched at the time of the completion of the etching, consumption of electric charges from the anode of the potentiostat is also stopped. By utilizing this relationship, the end point of the etching can be electrically detected. Accordingly, this method is very advantageous in terms of the transducer preparation process and the yield.

As the etching of the sacrificial layer proceeds, a cavity is formed. According to the above optical microscopy, no bubbles are observed in the cavity during the etching process, and generation of bubbles is observed on the surface of the counter electrode 18 composed of platinum. In preparation of a soft vibrating membrane of the capacitive transducer according to the present invention, bubbles are not generated in the cavity, and thus breaking of the vibrating membrane due to bubbles can be prevented.

Figure 3G:
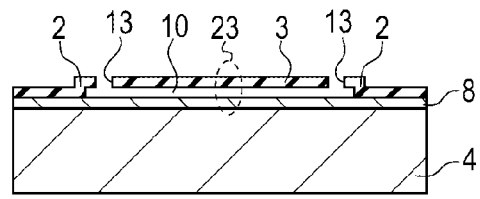
FIG. 3G is a cross-sectional view showing a step of the method according to Example 1 and the embodiment of the present invention.
Figure 3H:
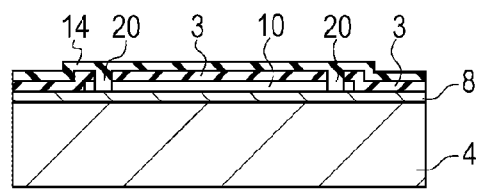
FIG. 3H is a cross-sectional view showing a step of the method according to Example 1 and the embodiment of the present invention.

After the completion of the electrolytic etching, the electrolytic etching device, the jig, the electrically connecting portion 35 etc. are detached, and the resulting substrate is cleaned by sequentially immersing in pure water (surface tension: 72 dynes/cm), an isopropyl alcohol (IPA) solution (surface tension: 20.8 dynes/cm), and an HPE 7100 solution (manufactured by Sumitomo 3M Limited., surface tension: 13 dynes/cm) in this order, and then naturally dried. As a result, as shown in FIG. 3G, a cavity 10 is formed so that a certain distance is maintained between the vibrating membrane 3 and the lower electrode 8 with the supporting portions 2 therebetween. When the distance between the upper and lower electrodes is small and a substrate is taken out from an etching solution, the upper and lower electrodes may adhere to each other due to the surface tension of the solution, and a sticking phenomenon may occur. As a result, in-plane variations in the transducer characteristics may be generated on the substrate. For this reason, as described above, it is necessary to perform the cleaning step so that the cleaning solutions (pure water, IPA solution, and HFE-7100) are used in descending order of the surface tension.

When a cavity region 23 located at a position equidistant from adjacent inlets 13 of the etching solution, as illustrated in FIG. 3G, is observed with an electron microscope, it is confirmed that fine particles having a size in the range of about 10 to 200 nm are scattered on the lower surface of the vibrating membrane 3.

Figure 5A:
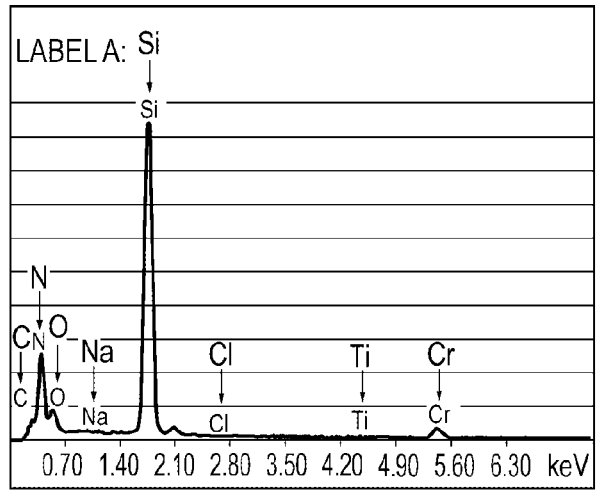
FIG. 5A is a chart showing a result of energy dispersive spectroscopy (EDS) in the present invention.
Figure 6:
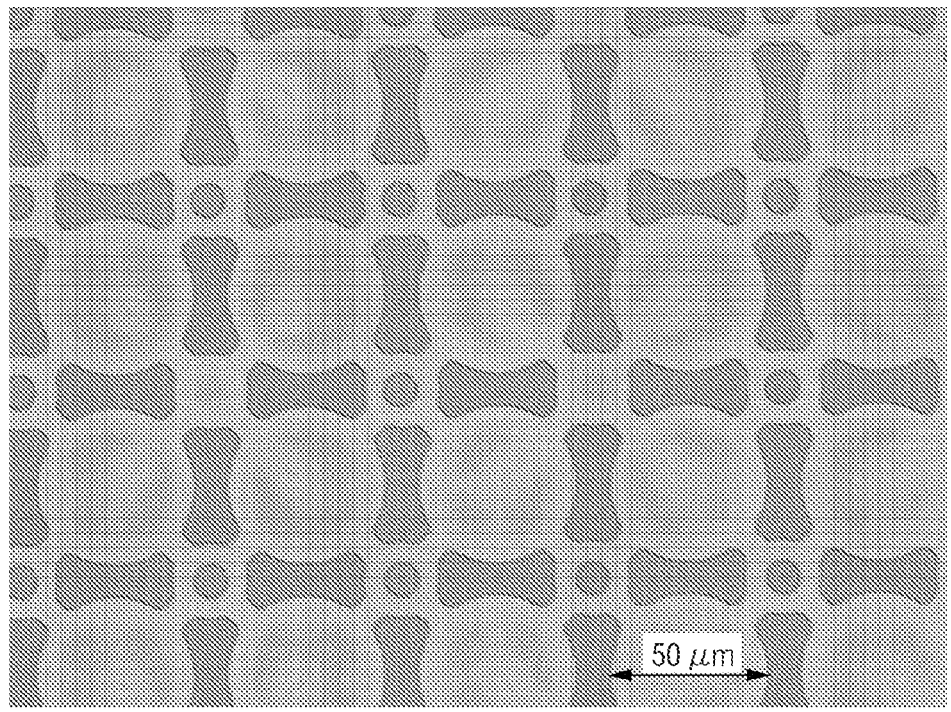
FIG. 6 is an optical micrograph of a transducer after the step of electrolytic etching in Example 1.

According to energy dispersive spectroscopy (EDS), as shown in FIG. 5A, the fine particles contain chromium and oxygen. Furthermore, according to X-ray photoelectron spectroscopy, the fine particles containing chromium and oxygen are composed of a chromium oxide (represented by $CrO_x$) containing $Cr_2O_3$ as a main component. According to optical microscopy, as shown in FIG. 6, interference fringes are observed on the lower surface of the vibrating membrane 3. These interference fringes show that sticking is not caused in the central portion of the vibrating membrane 3. Accordingly, it is found that this group of fine particles has an effect of preventing sticking.

Figure 7:
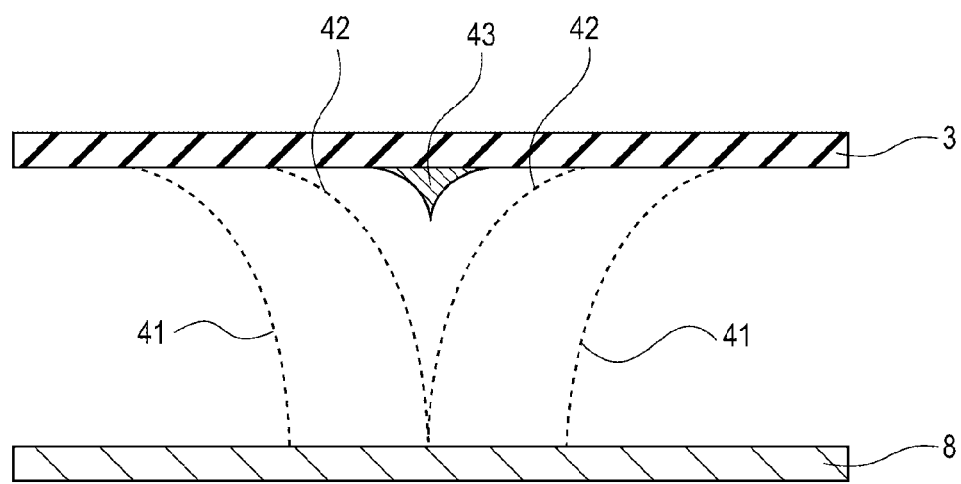
FIG. 7 is an enlarged cross-sectional view showing a cavity region 23 of the present invention.

This group of fine particles is formed near the cavity region 23 located at a position equidistant from adjacent inlets 13 of the etching solution. The reason for this will be described with reference to FIG. 7, which is an enlarged view showing the vicinity of the cavity region 23 illustrated in FIG. 3G. As shown in FIG. 7, contact surfaces 41 between the etching solution and the sacrificial layer isotropically expand from the inlets of the etching solution. In this step, since the lower electrode 8 supplies holes, electrolytic etching is started from the contact surfaces.

When the etching proceeds, and contact surfaces 42 between the sacrificial layer and the etching solution supplied from the adjacent inlets contact each other, as shown in FIG. 7, a path for supplying holes to the sacrificial layer is interrupted, and subsequent etching does not proceed any more (or the etching rate decreases). In addition, at the end of the etching, a fine particle (group) 43 composed of an oxide of the sacrificial layer 11 is formed on the lower surface of the $SiN_x$ film serving as the vibrating membrane 3 because of in-plane nonuniformity, variations, and the like of the substrate.

Figure 5B:
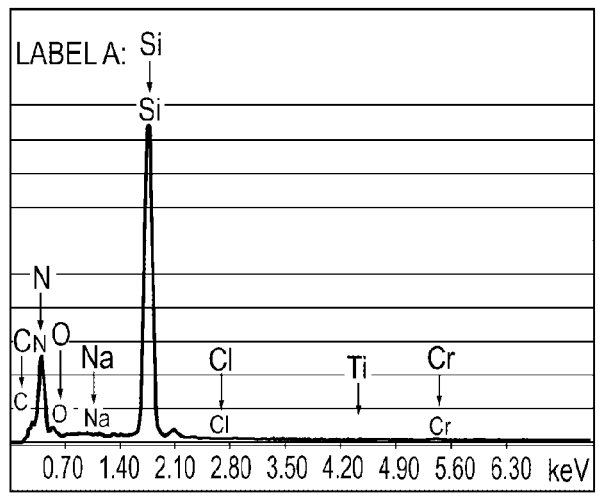
FIG. 5B is a chart showing a result of energy dispersive spectroscopy (EDS) in the present invention.

In contrast, according to the result of EDS of the lower surface of the vibrating membrane 3, as shown in FIG. 5B, the peak of chromium is not apparently observed on part of the lower surface of the $SiN_x$ film, the part being other than the fine particle (group) 43 composed of an oxide of the sacrificial layer 11.

Figure 5C:
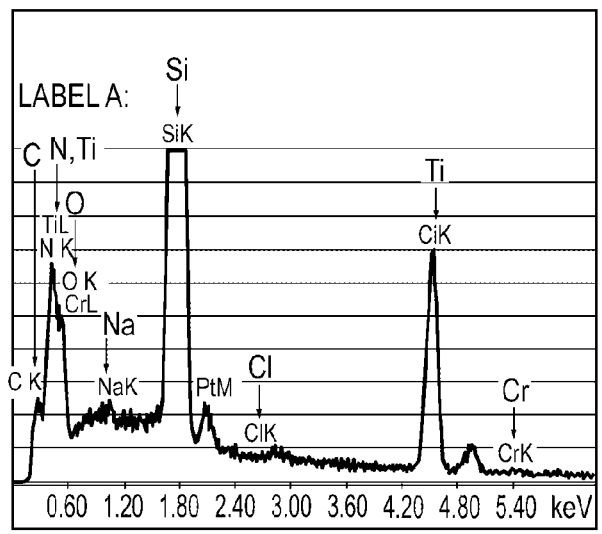
FIG. 5C is a chart showing a result of energy dispersive spectroscopy (EDS) in the present invention.

According to the result of electron microscopy after the electrolytic etching, fine particles having a size in the range of about 5 to 50 nm are scattered on the surface of the Ti lower electrode 8. As shown in FIG. 5C, according to the result of EDS of these fine particles, significant peaks of titanium (Ti) and oxygen (O) are observed. This result shows that fine particles containing Ti and O are formed on the surface of the lower electrode 8. Furthermore, according to X-ray photoelectron spectroscopy, the fine particles containing Ti and O are composed of a titanium oxide ($Ti_x$) containing $TiO_2$ as a main component.

Similarly, according to X-ray photoelectron spectroscopy and transmission electron microscopy, a titanium oxide layer having a thickness of about 10 nm is formed on the surface of the Ti lower electrode 8 after the electrolytic etching.

Next, as shown in FIG. 3H, a $SiN_x$ film is deposited as a sealing film 14 by plasma CVD. This $SiN_x$ film seals the inlets 13 of the etching solution to form sealing portions 20. The film used in this sealing step may be at least one selected from a nitride film, an oxide film, an oxynitride film, a polymeric resin film, a metal film, and an alloy film formed by chemical vapor deposition (CVD) or physical vapor deposition (PVD). Part of the film formed in this step covers the top surface of the vibrating membrane 3 and thus can be considered to be as a part of the vibrating membrane.

To seal the cavity 10 with the sealing portions 20, the thickness of the $SiN_x$ film for sealing is preferably ½ or more of the thickness of the sacrificial layer 11, more preferably equal to or larger than the thickness of the sacrificial layer 11, and most preferably 1.2 times or more the thickness of the sacrificial layer 11. A sealed cavity 10 can be formed by this sealing step.

The pressure in the step of plasma CVD is preferably in the range of 0.1 to several tens of Torr.

Figure 3I:
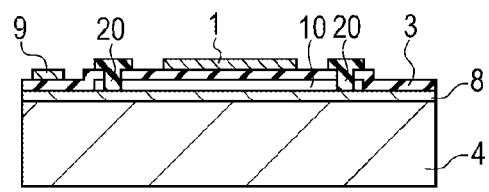
FIG. 3I is a cross-sectional view showing a step of the method according to Example 1 and the embodiment of the present invention.

Next, as shown in FIG. 3I, the sealing film 14 is patterned, and an Al film serving as an upper electrode 1 is then formed by PVD and patterned. The upper electrode 1 and a pad 9 for leading out wiring of the upper electrode 1 are formed on the vibrating membrane 3. Since only portions of the sealing film 14, the portions being located near the inlets of the etching solution, are sealed, the effect of mechanical rigidity on the vibrating membrane 3 can be minimized. In this step, unless the sealing film 14 is patterned, the distance between the upper and lower electrodes is increased owing to the thickness of the sealing film 14. As a result, the performance of the resulting transducer may degrade. In this Example, the upper electrode 1 is deposited using one type of material selected from metals, amorphous Si having a low resistance, and oxide semiconductors having a low resistance. To prevent oxidation of the surface of the upper electrode 1 or to prevent diffusion of a metal by heat, two or more electrically conductive films may be provided. That is, the upper electrode 1 may include two or more electrically conductive layers. Examples of the structure of the upper electrode 1 include Al/Cr, Mo/Ni, Cr/Al, and Cr/Cu. Thus, the pad 9 and the upper electrode 1 shown in FIG. 3I are electrically connected to each other.

Figure 3J:
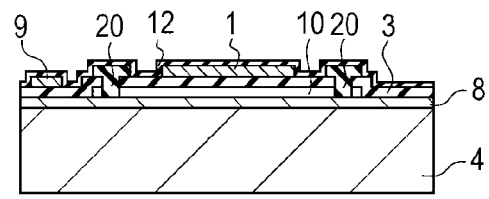
FIG. 3J is a cross-sectional view showing a step of the method according to Example 1 and the embodiment of the present invention.

Next, as shown in FIG. 3J, a protective film 12 is deposited on the upper electrode 1. Specifically, a $Si_3N_4$ film serving as the protective film 12 is deposited by plasma CVD. Instead of the $Si_3N_4$ film, the protective film 12 may be, for example, a $SiO_2$ film, a $SiO_xN_y$ film, or a polymeric resin film (e.g., a polydimethylsiloxane film or a parylene film).

Figure 3K:
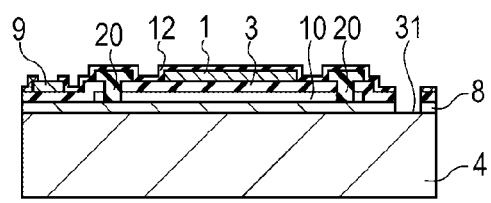
FIG. 3K is a cross-sectional view showing a step of the method according to Example 1 and the embodiment of the present invention.

Lastly, as shown in FIG. 3K, the protective film 12 and the $Si_3N_4$ film serving as the vibrating membrane 3 are patterned by a dry etching method, specifically, by RIF using a $CF_4$ gas plasma to form an upper electrode pad 9 and a lower electrode pad 31. When the protective film 12 is a polymeric resin film (e.g., a polydimethylsiloxane film or a parylene film), the pad 9 and the pad 31 can be formed by etching with an oxygen plasma. Thus, the steps of preparing the capacitive electromechanical transducer of this Example are completed.

In this Example, all the vibrating membrane 3, the protective film 12, and the sealing film 14 forming the sealing portions 20, all of which are shown in FIGS. 3D to 3K are insulating silicon nitride ($SiN_x$) films. When the same insulating material is selected as the vibrating membrane 3, the sealing film 14 forming the sealing portions 20, and the protective film 12, the integrated vibrating membrane 3, sealing film 14 forming the sealing portions 20, and protective film 12 function as a vibrating membrane as a whole.

In the present invention, the sealing portions 20 are not essential and are provided according to need. However, the sealing portions 20 are preferably provided because when acoustic waves are emitted into the air, in an unsealed transducer, the amplitude growth factor of resonance (also referred to as Q value) may de decreased by the damping effect of air. In the case where the capacitive electromechanical transducer of the present invention is used in a liquid phase, when transmission and reception are performed in a liquid, the performance of an unsealed transducer may be decreased by a large damping effect and low compressibility of the liquid. Accordingly, in such a case, it is particularly preferable to provide the sealing portions 20.

Example 2

Figure 8A:
FIG. 8A is a cross-sectional view showing a step of a method for manufacturing a capacitive electromechanical transducer according to Example 2 and an embodiment of the present invention.
Figure 8B:
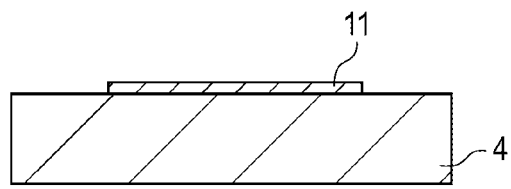
FIG. 8B is a cross-sectional view showing a step of the method according to Example 2 and the embodiment of the present invention.
Figure 8C:
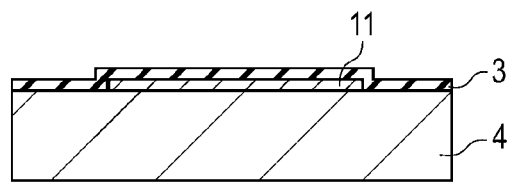
FIG. 8C is a cross-sectional view showing a step of the method according to Example 2 and the embodiment of the present invention.
Figure 8D:
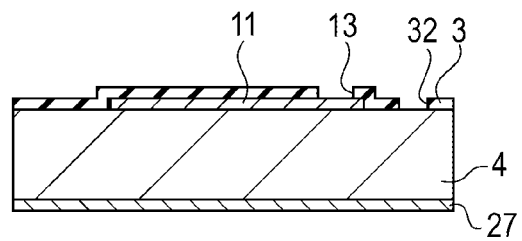
FIG. 8D is a cross-sectional view showing a step of the method according to Example 2 and the embodiment of the present invention.
Figure 8E:
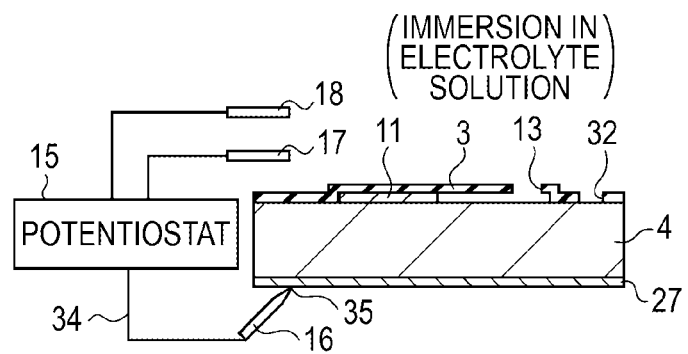
FIG. 8E is a cross-sectional view showing a step of the method according to Example 2 and the embodiment of the present invention.
Figure 8F:
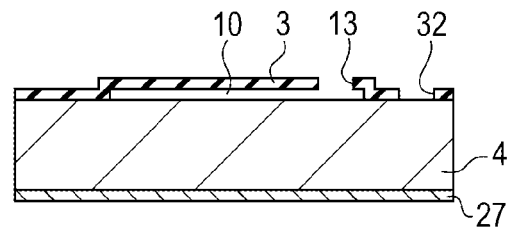
FIG. 8F is a cross-sectional view showing a step of the method according to Example 2 and the embodiment of the present invention.
Figure 8G:
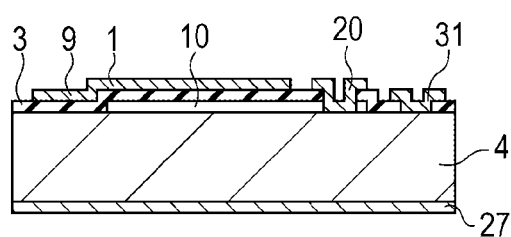
FIG. 8G is a cross-sectional view showing a step of the method according to Example 2 and the embodiment of the present invention.

FIGS. 8A to 8G are cross-sectional views illustrating steps of a method for manufacturing a capacitive electromechanical transducer according to Example 2 of the present invention. The method for manufacturing the transducer of this Example is substantially the same as Example 1, but differs from Example 1 in that the electrically conductive substrate 4 also functions as a lower electrode. In this Example, as shown in FIG. 8G, when an upper electrode 1 is formed, a sealing portion 20, a lower electrode pad 31, and an upper electrode pad 9 are also formed at the same time. Therefore, the capacitive electromechanical transducer can be manufactured more easily than the case of Example 1. Furthermore, since the sealing film is not provided, the thickness of the vibrating membrane 3 can be further reduced and the distance between the upper and lower electrodes can be further reduced to improve the sensitivity.

In this Example, the sealing portion 20 is composed of an electric conductor, and the potential thereof is the same as that of the substrate 4 serving as the lower electrode. Accordingly, the pattern of the sealing portion 20 is separated from the pattern of the upper electrode 1 so that the upper and lower electrodes are not short-circuited.

In this Example in which the substrate 4 also functions as the lower electrode, the series resistance in transducer circuits may be decreased in order to increase a sensing current of the transducer. Accordingly, the sheet resistance of the substrate 4 functioning as the lower electrode is preferably 20.0 ohm/square or less, more preferably 5.0 ohm/square or less, and most preferably 1.0 ohm/square or less. In order to increase the rate of the electrolytic etching and to facilitate charge transfer, the Si substrate used as the lower electrode may be doped with an impurity to form the lower electrode having a low resistance. In such a case, the surface impurity concentration is preferably $10^{14}$ cm$^{-3}$ or more, more preferably $10^{16}$ cm$^{-3}$ or more, and most preferably $10^{18}$ cm$^{-3}$ or more. Furthermore, in order to provide the holes described above, a P-type Si substrate can be used. For this purpose, a group III element such as boron or gallium can be used as the impurity dopant.

The transducer can be electrically separated by etching the substrate 4 by DRIE. As described above, by using a substrate, at least the surface of which has a low resistance, this Example can provide a configuration in which the substrate also functions as the lower electrode.

By providing an electrically conductive film 27 on the reverse face of the substrate 4, the contact resistance between the electrically connecting portion 35 mentioned above and the electrically conductive substrate 4 can be significantly decreased in the step of electrolytic etching. Furthermore, in order to eliminate unnecessary voltage drop, the electrically conductive film 27 can establish an ohmic contact with the electrically conductive substrate 4 (e.g., Si). Specifically, such a structure can be formed by depositing a Ti layer (with a thickness of, for example, 100 to 500 nm) on a surface of a low-resistance Si substrate, and then annealing the resulting substrate.

FIG. 8G shows an example in which the lower electrode pad 31 is disposed at a side of the cavity 10 of the transducer. Alternatively, the lower electrode pad 31 may be disposed on the reverse face of the substrate 4. Other structures are the same as those of Example 1.

This Example shows a structure in which no protective film is provided. However, when a protective film is provided, the protective film can be arranged as in Example 1. In particular, when wiring is taken from an electrode pad, for example, the above-mentioned polymeric resin film (e.g., a polydimethyl-siloxane film or a parylene film) that can be formed at a low temperature is more preferably used.

Example 3

FIGS. 9A to 9K are cross-sectional views illustrating steps of a method for manufacturing a capacitive electromechanical transducer according to Example 3 of the present invention.

Figure 9A:
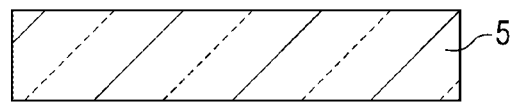
FIG. 9A is a cross-sectional view showing a step of a method for manufacturing a capacitive electromechanical transducer according to Example 3 and an embodiment of the present invention.
Figure 9B:
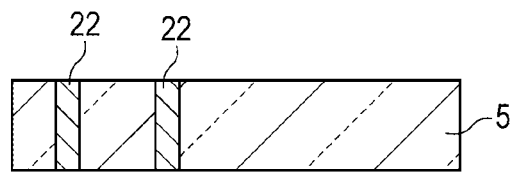
FIG. 9B is a cross-sectional view showing a step of the method according to Example 3 and the embodiment of the present invention.
Figure 9C:
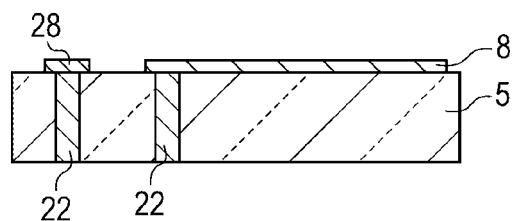
FIG. 9C is a cross-sectional view showing a step of the method according to Example 3 and the embodiment of the present invention.
Figure 9D:
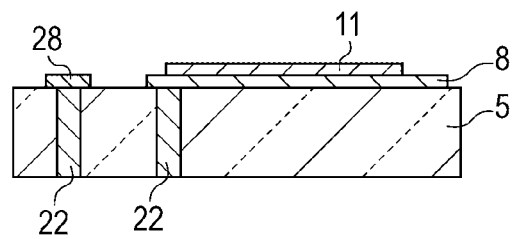
FIG. 9D is a cross-sectional view showing a step of the method according to Example 3 and the embodiment of the present invention.
Figure 9E:
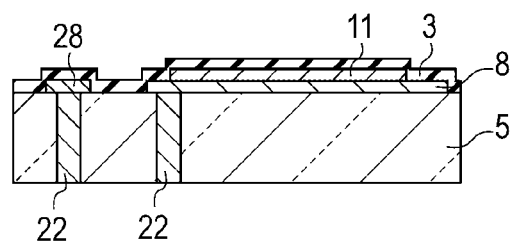
FIG. 9E is a cross-sectional view showing a step of the method according to Example 3 and the embodiment of the present invention.
Figure 9F:
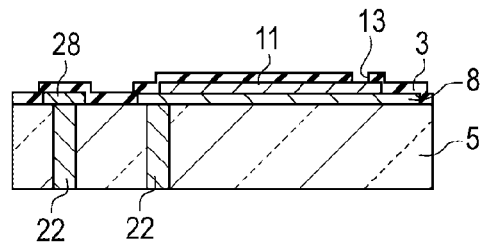
FIG. 9F is a cross-sectional view showing a step of the method according to Example 3 and the embodiment of the present invention.

The method for manufacturing the transducer of this Example is substantially the same as Examples 1 and 2 but differs from Examples 1 and 2 in that an insulating substrate (e.g., a glass substrate) is used without using an electrically conductive substrate. As shown in FIG. 9A, a substrate 5 (glass substrate with a diameter of 4 inches) is prepared and cleaned. Next, as shown in FIG. 9B, through-wiring conductive portions 22 that penetrate the substrate 5 are formed.

A substrate including such through-wiring conductive portions can be prepared by, for example, forming through-holes in a photosensitive glass substrate (product name: PEG3, manufactured by HOYA Corporation), and then filling the through-holes with copper or nickel by plating. After the formation of such metal through-wiring conductive portions, the surfaces of the substrate are polished by chemical mechanical polishing (CMP) to form a substrate having through-wiring conductive portions. In the capacitive transducer of the present invention, a large surface roughness of the substrate may adversely affect the design of the cavity (for example, projecting portions of such a rough surface of the substrate may contact the vibrating membrane during vibration of the vibrating membrane). Accordingly, the mean roughness Ra of the substrate is preferably 10 nm or less, and more preferably 2 nm or less. The difference in the height between the exposed surface of each through-wiring conductive portion 22 and the substrate 5 is preferably 1 micrometer or less, and more preferably 0.2 micrometers or less.

Alternatively, the through-wiring conductive portions 22 can be formed by etching a Si substrate by a DRIE method to form through-holes, followed by thermal oxidation and low-pressure chemical vapor deposition (LPCVD). In this case, insulation of the through-wiring conductive portions 22 can be formed by the thermal oxidation. The through-wiring conductive portions 22 can be formed of doped LPCVD polycrystalline silicon.

Figure 9G:
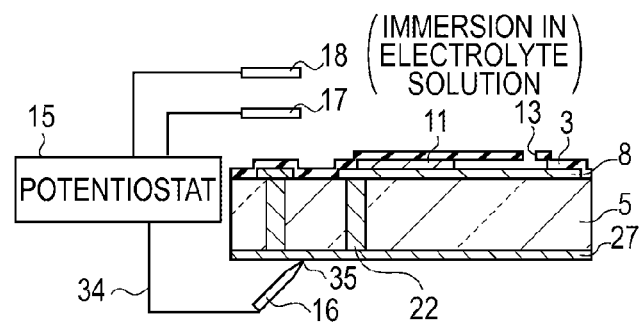
FIG. 9G is a cross-sectional view showing a step of the method according to Example 3 and the embodiment of the present invention.

Steps shown in FIGS. 9A to 9F are the same as the steps described in Examples 1 and 2. Next, as shown in FIG. 9G, an electrically conductive film 27, for example, a Ti film (with a thickness of 100 nm) is deposited on the reverse face of the substrate 5. Subsequently, the electrically conductive film 27 provided on the reverse face of the substrate is brought into contact with a working electrode 16 using a single-side etching jig (not shown) to form an electrically connecting portion 35. Subsequently, the substrate is immersed in an electrolyte solution as in Example 1, and a sacrificial layer 11 that is in contact with a lower electrode 8 is electrolytically etched through the electrically conductive film 27 and a through-wiring conductive portion 22.

Figure 9H:
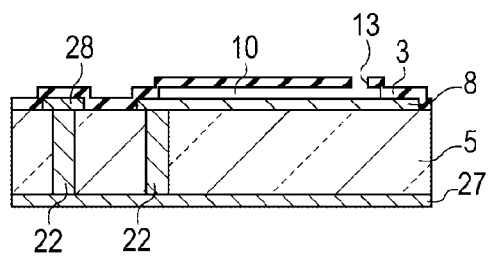
FIG. 9H is a cross-sectional view showing a step of the method according to Example 3 and the embodiment of the present invention.

Next, as shown in FIG. 9H, as in Example 1, after the electrolytic etching, a drying step is performed to form a cavity 10 that is opened in air.

Figure 9I:
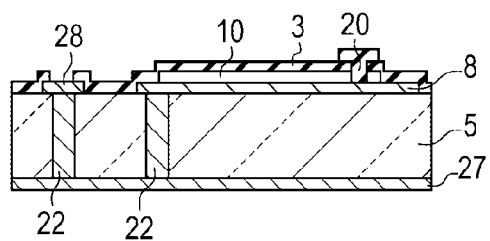
FIG. 9I is a cross-sectional view showing a step of the method according to Example 3 and the embodiment of the present invention.
Figure 9J:
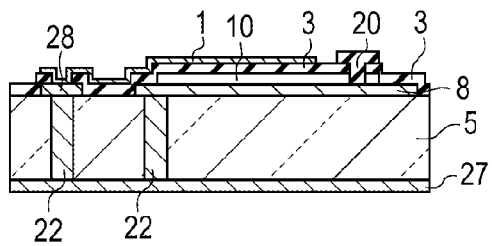
FIG. 9J is a cross-sectional view showing a step of the method according to Example 3 and the embodiment of the present invention.

Subsequently, as shown in FIG. 9I, an inlet 13 of the etching solution is sealed with a SiN$_x$ film formed by plasma CVD to form a sealing portion 20 as in Example 1. Next, an opening for a connecting wiring portion 28 that connects a through-wiring conductive portion 22 to an upper electrode 1 is formed by RIE. Subsequently, as shown in FIG. 9J, a metal layer is deposited and patterned to form the wiring portion 28 that connects the upper electrode 1 to the through-wiring conductive portion 22 at the same time.

Figure 9K:
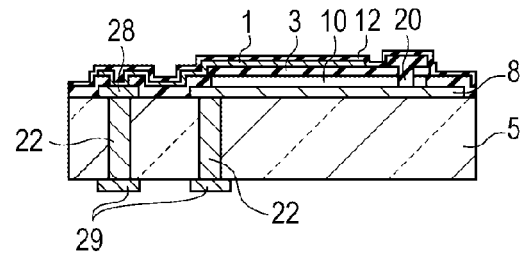
FIG. 9K is a cross-sectional view showing a step of the method according to Example 3 and the embodiment of the present invention.

Next, as shown in FIG. 9K, an insulating protective film 12 is formed on the upper electrode 1 as in Example 1. Lastly, the electrically conductive film 27 provided on the reverse face of the substrate 5 is patterned to form electrode pads of the through-wiring conductive portions 22 on the reverse face of the substrate 5. According to this structure, as shown in FIG. 9K, the lower electrode 8 and the upper electrode 1 can be led to the reverse face of the substrate 5. In particular, this technique is important in preparation of a high-density transducer array.

In FIG. 9K, which illustrates this Example, both the lower electrode 8 and the upper electrode 1 are connected to the corresponding through-wiring conductive portion 22. Alternatively, one of the lower electrode 8 and the upper electrode 1 may be connected to a through-wiring conductive portion 22, and the other electrode may be led to the top surface of the substrate.

Example 4

FIGS. 10A to 10E are cross-sectional views illustrating steps of a method for manufacturing a capacitive electromechanical transducer according to Example 4 of the present invention.

The method for manufacturing the transducer of this Example is the same as Example 3 except that a sealing portion, a connecting wiring portion, and a lower electrode pad are formed at the same time. In this Example, $SiN_x$ is not used in the sealing step, and, as in Example 2, a sealing portion 20, a connecting wiring portion 28, and a lower electrode pad 9 are formed at the same when an upper electrode 1 is formed. Thus, the transducer can be prepared more easily.

Figure 10A:
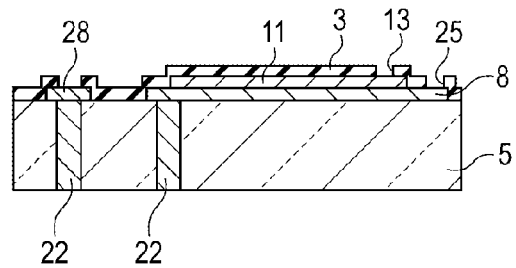
FIG. 10A is a cross-sectional view showing a step of a method for manufacturing a capacitive electromechanical transducer according to Example 4 and an embodiment of the present invention.
Figure 10B:
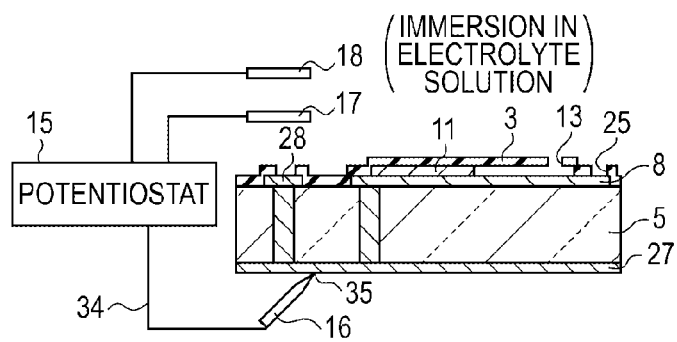
FIG. 10B is a cross-sectional view showing a step of the method according to Example 4 and the embodiment of the present invention.
Figure 10C:
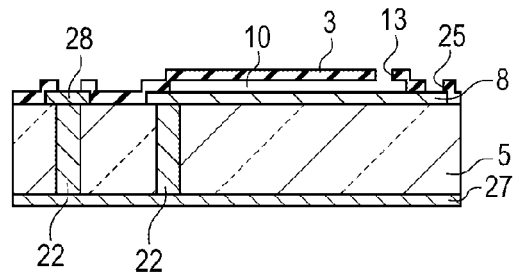
FIG. 10C is a cross-sectional view showing a step of the method according to Example 4 and the embodiment of the present invention.
Figure 10D:
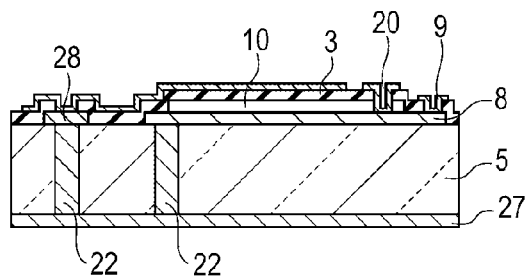
FIG. 10D is a cross-sectional view showing a step of the method according to Example 4 and the embodiment of the present invention.
Figure 10E:
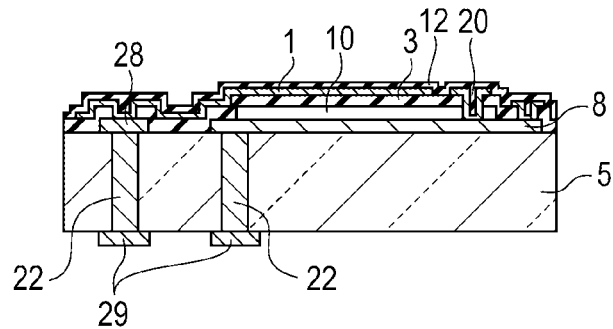
FIG. 10E is a cross-sectional view showing a step of the method according to Example 4 and the embodiment of the present invention.

As shown in FIG. 10D, since a measurement is performed in the course of the preparation of the device, a description is made of a structure in which the lower electrode pad 9 is formed on the surface of the substrate. However, the structure is not limited thereto. An upper electrode pad may be formed on the surface of the substrate.

Example 5

FIGS. 11A to 11D are cross-sectional views illustrating steps of a method for manufacturing a capacitive electromechanical transducer according to Example 5 of the present invention. According to the structure of the transducer manufactured by the method of this Example, holes necessary for an electrolytic etching reaction are supplied not to a lower electrode but to an upper electrode through an electrically conductive substrate. Other steps are the same as those in Example 1.

Figure 11A:
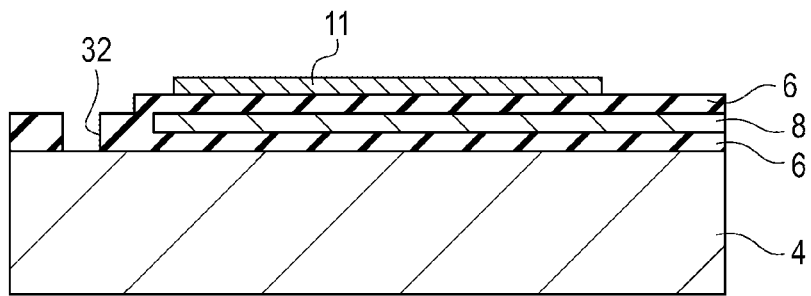
FIG. 11A is a cross-sectional view showing a step of a method for manufacturing a capacitive electromechanical transducer according to Example 5 and an embodiment of the present invention.

As shown in FIG. 11A, a structure in which a titanium lower electrode 8 is sandwiched between insulating layers 6 (composed of, for example, $SiN_x$ or $SiO_x$) is formed on an electrically conductive substrate 4. Subsequently, an opening 32 reaching the substrate 4 is formed by RIE. Next, a sacrificial layer 11 (composed of, for example, Cr) is formed on the top surface of the substrate 4.

Figure 11B:
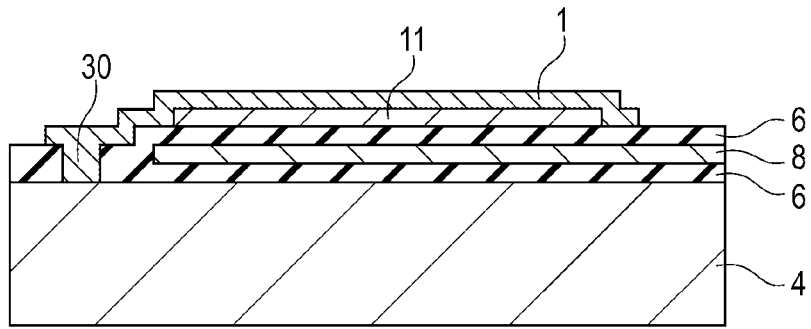
FIG. 11B is a cross-sectional view showing a step of the method according to Example 5 and the embodiment of the present invention.

Next, as shown in FIG. 11B, an upper electrode 1 (composed of, for example, Al) is deposited on the sacrificial layer 11 and then patterned to form, at the same time, a connecting wiring portion 30 that connects the substrate 4 to the upper electrode 1.

Figure 11C:
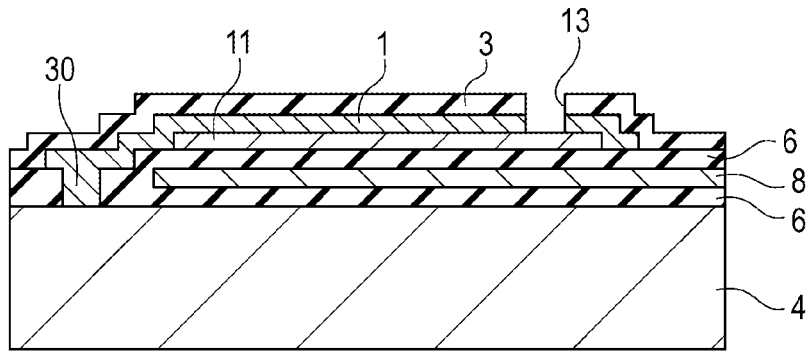
FIG. 11C is a cross-sectional view showing a step of the method according to Example 5 and the embodiment of the present invention.

Next, a vibrating membrane 3 is deposited on the upper electrode 1 by plasma CVD. Subsequently, as shown in FIG. 11C, an inlet 13 of an etching solution can be formed from the top surface of the substrate 4 to the sacrificial layer 11. For example, when the sacrificial layer 11 is composed of Cr, the upper electrode 1 is composed of Ti, and the vibrating membrane 3 is composed of $SiN_x$, the $SiN_x$ can be etched by RIE using a $CF_4$ gas plasma as in Example 1. Alternatively, the etching can be performed with an etching solution containing hydrofluoric acid (HF) (e.g., 49% HF solution: 30% $H_2O$=1: 1:20). By performing etching under these conditions, the top surface of the Cr sacrificial layer 11 can be exposed without etching Cr.

Figure 12A:
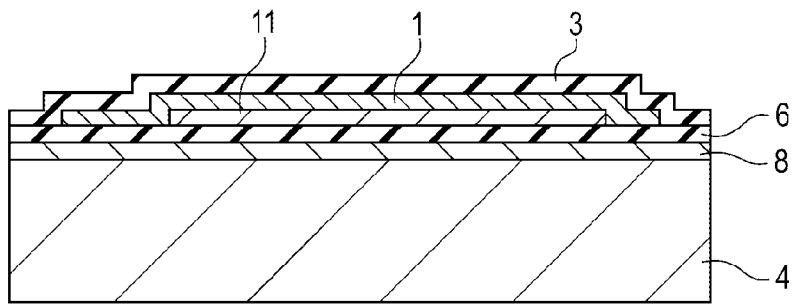
FIG. 12A is a cross-sectional view showing a step of a method for manufacturing a capacitive electromechanical transducer according to Example 6 and an embodiment of the present invention.
Figure 12B:
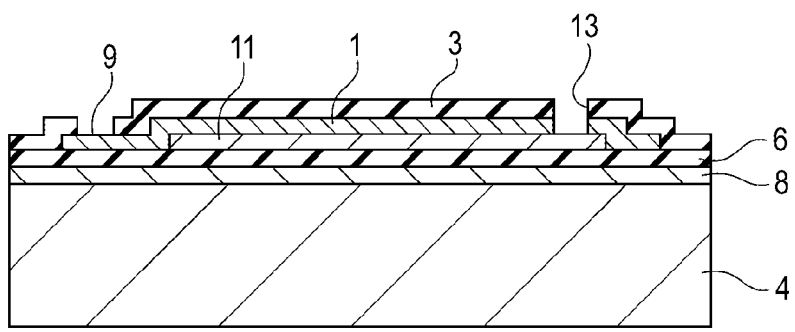
FIG. 12B is a cross-sectional view showing a step of the method according to Example 6 and the embodiment of the present invention.
Figure 12C:
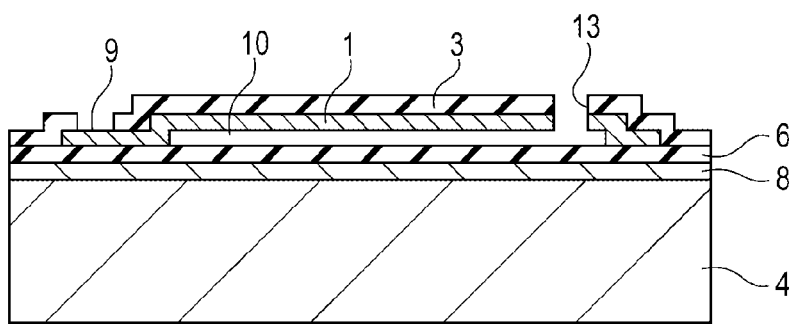
FIG. 12C is a cross-sectional view showing a step of the method according to Example 6 and the embodiment of the present invention.

As a result, as shown in FIG. 12C, the upper electrode 1 is electrically connected to the substrate 4 through the connecting wiring portion 30. Accordingly, electrolytic etching can be performed through the electrically conductive substrate 4.

Figure 11D:
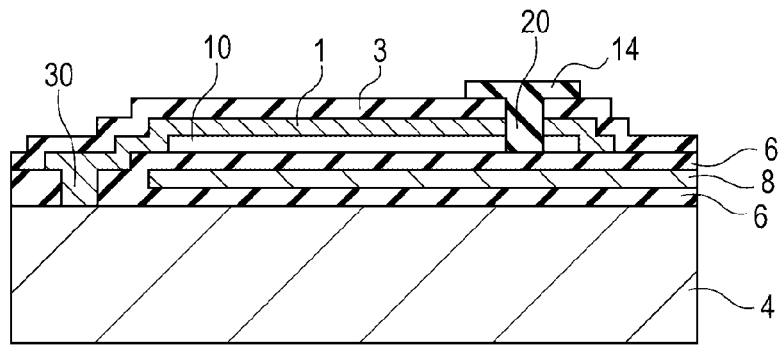
FIG. 11D is a cross-sectional view showing a step of the method according to Example 5 and the embodiment of the present invention.

Next, a drying step is performed. Subsequently, as shown in FIG. 11D, an insulating sealing film 14 (e.g., a plasma-CVD $Si_3N_4$ film or a plasma-CVD $SiO_2$ film) is deposited to seal the inlet 13 of the etching solution. The sealing film 14 is then patterned to form a sealing portion 20 that seals the inlet 13 of the etching solution.

When the sealing film 14 is not patterned, the sealing film 14 can also be used as a protective film without further treatment, and can function as a vibrating membrane portion added on the original vibrating membrane 3.

In FIG. 11D, a protective film, a pad of the lower electrode 8, and an upper electrode pad led from the substrate 4 are omitted. These electrode pads can be optionally formed as in Example 1. Other structures are the same as those of Example 1.

Example 6

FIGS. 12A to 12D are cross-sectional views illustrating steps of a method for manufacturing a capacitive electromechanical transducer according to Example 6 of the present invention. According to the structure of the transducer manufactured by the method of this Example, holes necessary for electrolytic etching are supplied not through an electrically conductive substrate but directly to an upper electrode through an upper electrode pad. Other structures are the same as those of Example 5.

As shown in FIG. 12A, on an electrically conductive substrate 4, a lower electrode 8, a silicon nitride ($SiN_x$) insulating film 6, a patterned chromium (Cr) sacrificial layer 11, a titanium (Ti) upper electrode 1, and a silicon nitride ($SiN_x$) vibrating membrane 3 are formed in this order. Next, as shown in FIG. 12B, the $SiN_x$ vibrating membrane 3 is patterned to form an upper electrode pad 9. In forming an inlet 13 of an etching solution, the inlet 13 leading to the upper electrode 1, the step of patterning the inlet 13 of the etching solution is conducted as in the step of patterning the $SiN_x$ vibrating membrane 3 and the Ti upper electrode described in Example 5.

As shown in FIG. 12C, since the pad 9 of the upper electrode 1 is electrically connected to the upper electrode 1, electrolytic etching can be performed through the upper electrode pad 9.

Figure 12D:
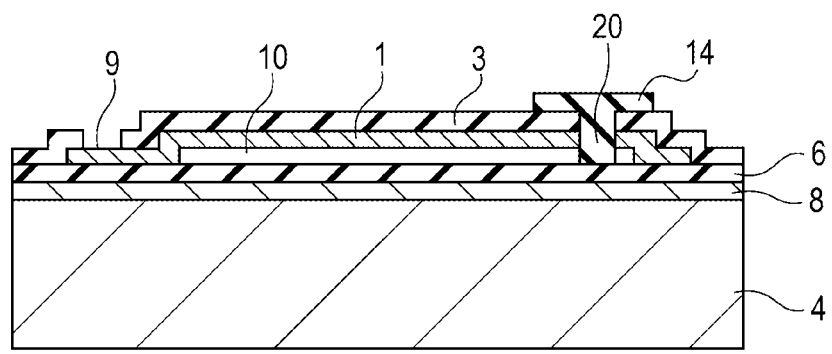
FIG. 12D is a cross-sectional view showing a step of the method according to Example 6 and the embodiment of the present invention.

As shown in FIG. 12D, the lower electrode 8 is covered with the insulating film 6. Subsequently, an insulating sealing film 14, such as a plasma-CVD $Si_3N_4$ film or a plasma-CVD $SiO_2$ film, is deposited to seal the inlet 13 of the etching solution. The sealing film 14 is then patterned to form a sealing portion 20 that seals the inlet 13 of the etching solution.

When the sealing film 14 is not patterned, the sealing film 14 can also be used as a protective film without further treatment, and can function as a vibrating membrane portion added on the original vibrating membrane 3.

In FIG. 12D, a pad of the lower electrode 8 and a protective film are omitted. The protective film can be optionally formed as in Example 1.

Example 7

FIGS. 13A to 13E are cross-sectional views illustrating steps of a method for manufacturing a capacitive electromechanical transducer according to Example 7 of the present invention. According to the structure of the transducer manufactured by the method of this Example, as in Examples 5 and 6, holes necessary for electrolytic etching are supplied not through a lower electrode but directly to an upper electrode through a through-wiring conductive portion and an upper electrode connecting portion thereof. Other structures are the same as those of Example 3.

Figure 13A:
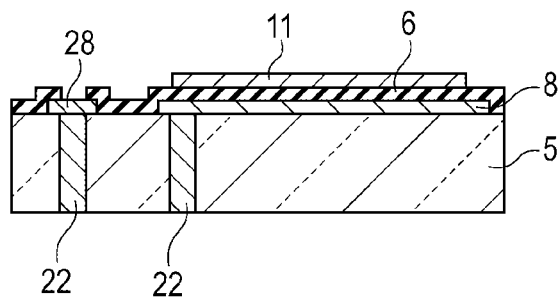
FIG. 13A is a cross-sectional view showing a step of a method for manufacturing a capacitive electromechanical transducer according to Example 7 and an embodiment of the present invention.
Figure 13B:
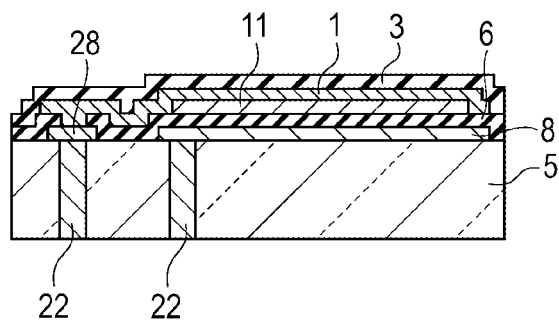
FIG. 13B is a cross-sectional view showing a step of the method according to Example 7 and the embodiment of the present invention.
Figure 13C:
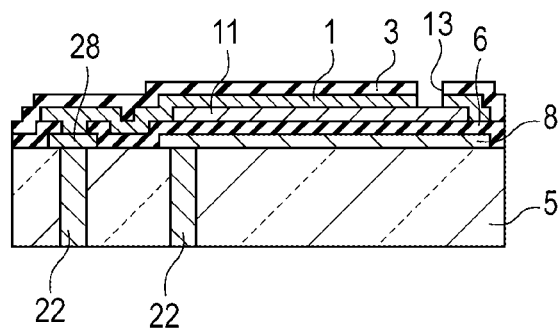
FIG. 13C is a cross-sectional view showing a step of the method according to Example 7 and the embodiment of the present invention.

As shown in FIG. 13C, in forming an inlet 13 of an etching solution, the inlet 13 leading to an upper electrode 1, the step of patterning the inlet 13 of the etching solution is conducted as in the step of patterning the $SiN_x$ vibrating membrane 3 and the Ti upper electrode described in Example 5.

Figure 13D:
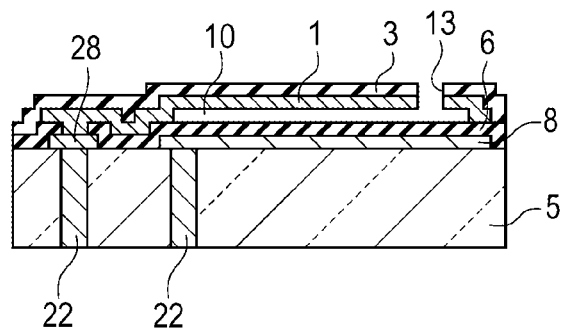
FIG. 13D is a cross-sectional view showing a step of the method according to Example 7 and the embodiment of the present invention.

Subsequently, as shown in FIG. 13D, a sacrificial layer 11 that is in contact with the upper electrode 1 is electrolytically etched via through-wiring conductive portions 22 to form a cavity 10. The step of the electrolytic etching is performed as in Examples 1, 5, and 6.

Figure 13E:
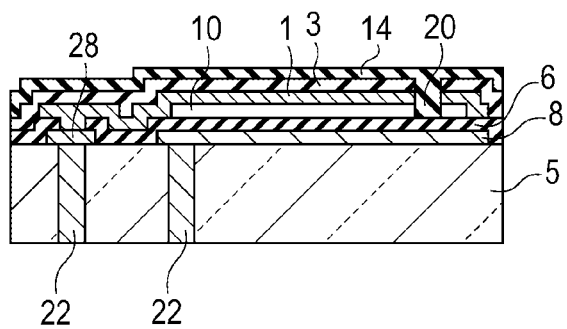
FIG. 13E is a cross-sectional view showing a step of the method according to Example 7 and the embodiment of the present invention.

Lastly, as shown in FIG. 13E, the inlet 13 of the etching solution is sealed with a sealing film 14 (e.g., a plasma-CVD $Si_3N_4$ film or a plasma-CVD $SiO_2$ film). According to this structure, the sealing film 14 can also function as a protective film.

In FIG. 13E, through-wiring pads 29 and a protective film are not shown on the reverse face of a substrate 5. In Examples 1 to 7, one transducer portion and the peripheral structure of the transducer have been described. In manufacturing a transducer array having a large area, the transducer portions each having the structure illustrated in the respective drawings are periodically or orderly arranged on a substrate. The structures and the methods for manufacturing the transducers are basically the same as those described above.

A flow path for connecting a plurality of cavities 10 to each other may be provided between the cavities 10. In such a case, the resulting cavity group having the common flow path can share an inlet of an etching solution and an electrode that provides holes. This structure is advantageous in that, for example, the number of openings formed in the vibrating membrane 3 can be decreased, and stability of mechanical characteristics of the capacitive electromechanical transducer can be further increased.

In Examples described above, the vibrating portion is composed of a stacked film including the vibrating membrane 3, the upper electrode 1, the sealing film, and the like. In Examples, for ease of explanation, the sealing film etc. are described as part of the vibrating membrane 3 and the protective film 12 etc. are described as films different from the vibrating membrane 3. However, the protective film etc. may be integrated with part of the vibrating membrane 3.

In Examples 1 to 4, the $SiN_x$ vibrating membrane 3 has, as an insulating film, a function of preventing a short-circuit between the upper and lower electrodes. In Examples 5 to 7, since the insulating film 6 can prevent the upper and lower electrodes from short-circuiting, the vibrating membrane 3 need not always have an insulating property. Accordingly, an electrically conductive vibrating membrane 3 can also be used so long as an insulating protective film for ensuring insulation is separately provided.

Example 8

FIGS. 14A to 14D are cross-sectional views illustrating steps of a method for manufacturing a capacitive electromechanical transducer according to Example 8 of the present invention. According to the structure of the transducer manufactured by the method of this Example, holes necessary for electrolytic etching are supplied not through an electrically conductive substrate but directly to an upper electrode through an upper electrode pad. Initial steps in the method of this Example are the same as those in Examples 5 and 6. In this Example, a description will be made of a case where an electrically conductive substrate 4 is composed of silicon (Si) and a lower electrode 8 is composed of highly doped silicon (Si).

Figure 14A:
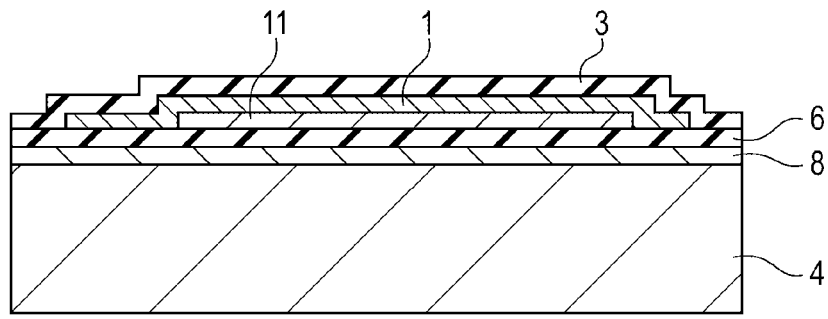
FIG. 14A is a cross-sectional view showing a step of a method for manufacturing a capacitive electromechanical transducer according to Example 8 and an embodiment of the present invention.

As shown in FIG. 14A, on the electrically conductive substrate 4, the lower electrode 8, a silicon nitride (SiN) insulating film 6, a patterned chromium (Cr) sacrificial layer 11, a titanium (Ti) upper electrode 1, and a silicon nitride ($SiN_x$) vibrating membrane 3 are formed in this order.

Figure 14B:
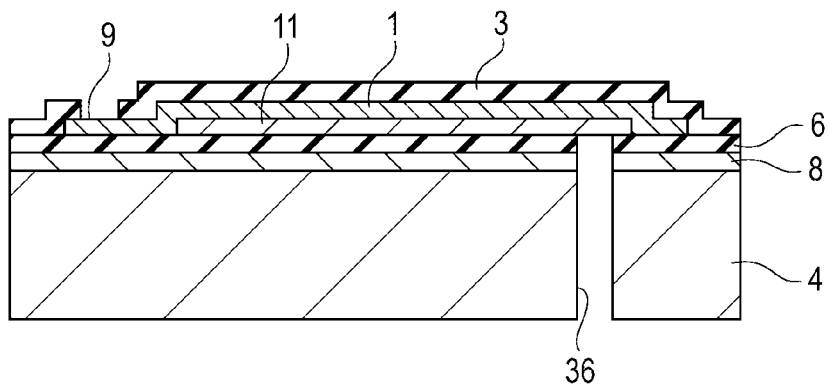
FIG. 14B is a cross-sectional view showing a step of the method according to Example 8 and the embodiment of the present invention.

Next, as shown in FIG. 14B, the $SiN_x$ vibrating membrane 3 is patterned to form an upper electrode pad 9. Next, plasma dry etching is performed from the reverse face of the substrate to the Cr sacrificial layer 11 through the Si substrate 4, the lower electrode 8, and the insulating film 6 using $SF_6$ gas for deep etching with a Deep RIE etcher (manufactured by STS). In the $SF_6$ gas plasma, since the etching selectivity of Cr to Si and $SiN_x$ is sufficiently high, an etching reaction reaches the lower surface of the Cr sacrificial layer 11 to form a through-hole 36 on the reverse face of the substrate 4.

In FIG. 14B, an etching mask for deep etching, for example, a thick film photoresist, a $SiO_2$ film, or a Cr film is omitted.

Subsequently, when the substrate 4 fixed with a single-side etching jig is immersed in an electrolytic etching solution as in Examples 1 and 3, the electrolytic etching solution enters the through-hole 36 provided on the reverse face of the substrate 4.

Figure 14C:
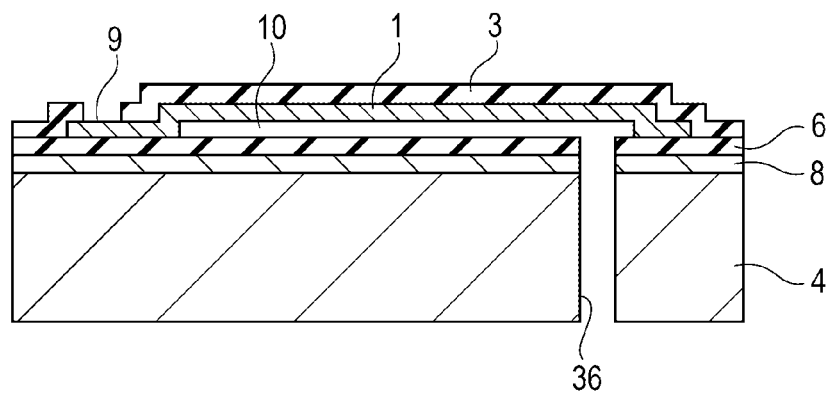
FIG. 14C is a cross-sectional view showing a step of the method according to Example 8 and the embodiment of the present invention.

As shown in FIG. 14C, since the pad 9 of the upper electrode 1 is electrically connected to the upper electrode 1, electrolytic etching can be performed through the upper electrode pad 9. A drying step is then performed to form a cavity 10.

Figure 14D:
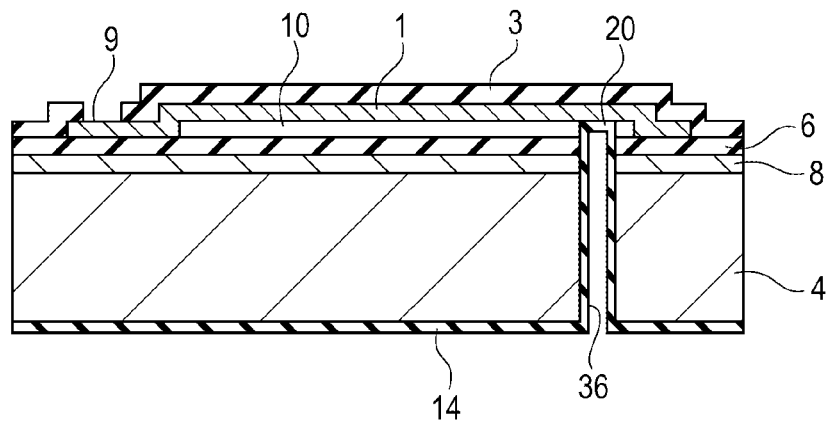
FIG. 14D is a cross-sectional view showing a step of the method according to Example 8 and the embodiment of the present invention.

Next, as shown in FIG. 14D, an insulating sealing film 14 such as a plasma-CVD $Si_3N_4$ film or a plasma-CVD $SiO_2$ film is deposited on the reverse face of the substrate 4 to seal the through-hole 36.

A pad of the lower electrode 8, a protective film, and the like are omitted in FIG. 14D.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-121006, filed May 19, 2009, which is hereby incorporated by reference herein in its entirety.

The invention claimed is:

1. A method for manufacturing a capacitive electromechanical transducer that converts between mechanical energy and electrical energy by means of a displacement of a vibrating membrane, the method comprising the steps of:
   forming a first electrode on a substrate;
   forming a sacrificial layer on the first electrode;
   forming a vibrating membrane on the sacrificial layer, the vibrating membrane being provided with a second electrode;
   forming an opening that communicates the sacrificial layer with the outside; and forming a cavity by electrolytically etching the sacrificial layer in an electrolyte solution by applying an electric field between the first electrode and a third electrode provided outside, wherein the sacrificial layer is composed of an electrically conductive material having a smaller dissolution potential than the dissolution potential of the first electrode, and an electric potential applied between the first electrode and the third electrode in the step of forming the cavity is larger than the dissolution potential of the sacrificial layer and is smaller than the dissolution potential of the first electrode.

2. The method according to claim 1, further comprising a step of:

forming an insulating film on the first electrode before the step of forming the sacrificial layer.

3. The method according to claim 2, wherein the substrate also functions as the first electrode.

4. The method according to claim 2, wherein the sacrificial layer is completely included within a region in which the first electrode is formed.

5. The method according to claim 2, further comprising a step of:

sealing the opening.

6. The method according to claim 1, wherein the substrate also functions as the first electrode.

7. The method according to claim 6, wherein the sacrificial layer is completely included within a region in which the first electrode is formed.

8. The method according to claim 3, further comprising a step of:

sealing the opening.

9. The method according to claim 1, wherein the sacrificial layer is completely included within a region in which the first electrode is formed.

10. The method according to claim 9, further comprising a step of:

sealing the opening.

11. The method according to claim 1, further comprising a step of:

sealing the opening.

* * * * *